(12) United States Patent
Park et al.

(10) Patent No.: US 9,625,816 B2
(45) Date of Patent: Apr. 18, 2017

(54) METHODS OF FORMING PATTERNS USING PHOTORESIST POLYMERS

(71) Applicants: Jin Park, Yongin-si (KR); Hyun-Woo Kim, Seongnam-si (KR); Jin-Kyu Han, Hwaseong-si (KR)

(72) Inventors: Jin Park, Yongin-si (KR); Hyun-Woo Kim, Seongnam-si (KR); Jin-Kyu Han, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 14/886,155

(22) Filed: Oct. 19, 2015

(65) Prior Publication Data

US 2016/0154306 A1 Jun. 2, 2016

(30) Foreign Application Priority Data

Nov. 27, 2014 (KR) .................. 10-2014-0167424

(51) Int. Cl.
*G03F 7/039* (2006.01)
*G03F 7/36* (2006.01)
(Continued)

(52) U.S. Cl.
CPC .......... *G03F 7/0392* (2013.01); *G03F 7/0045* (2013.01); *G03F 7/26* (2013.01); *G03F 7/30* (2013.01)

(58) Field of Classification Search
CPC ....... H01L 2924/00014; H01L 2924/00; H01L 2924/0002; H01L 2224/48227; H01L 2224/32225; H01L 2224/73265; H01L 2224/48091; H01L 2924/00012; H01L 2224/45144; H01L 2924/181; H01L 2224/32145; H01L 51/56; H01L 2924/15311; H01L 51/0072; H01L 2224/16225; H01L 2224/45015; H01L 51/0067; H01L 51/5237; H01L 2224/73204; H01L 51/5012; H01L 51/0085; H01L 51/5016; H01L 51/5253; H01L 2924/00013; H01L 2924/12042; H01L 27/3244; H01L 29/7869; H01L 2924/014; H01L 51/0081; H01L 51/0071; H01L 51/0052; H01L 51/0074;
(Continued)

(56) References Cited

U.S. PATENT DOCUMENTS 5,204,225 A 4/1993 Feely
5,686,221 A 11/1997 Koletar
(Continued)

FOREIGN PATENT DOCUMENTS

JP 06-011834 1/1994
JP 2003-252855 9/2003
(Continued)

OTHER PUBLICATIONS

Khazaei et al, Journal of Chemical Research, Jun. 2005, pp. 391-393.*

*Primary Examiner* — Cynthia Hamilton
(74) *Attorney, Agent, or Firm* — Myers Bigel, P.A.

(57) ABSTRACT

A photoresist polymer comprising a first repeating unit including a halogen donor group and a second repeating unit including a protecting group connected by a sulfide bond.

20 Claims, 17 Drawing Sheets

(51) Int. Cl.
*G03F 7/32* (2006.01)
*G03F 7/20* (2006.01)
*G03F 7/16* (2006.01)
*G03F 7/26* (2006.01)
*G03F 7/004* (2006.01)
*G03F 7/30* (2006.01)

(58) Field of Classification Search
CPC ........... H01L 2224/131; H01L 51/5048; H01L 2224/45139; H01L 2924/01029; H01L 27/11582; H01L 2224/13111; H01L 27/124; H01L 2924/01047; H01L 2924/01033; H01L 51/0059; H01L 2224/94; H01L 27/3211; H01L 2924/07802; H01L 2224/0401; H01L 2224/05639; H01L 2224/05655; H01L 2924/01082; H01L 2224/45124; H01L 25/0657; H01L 27/3276; H01L 2924/10253; H01L 51/5088; H01L 51/5246; H01L 2224/05624; H01L 2224/16145; H01L 51/0094; H01L 2251/308; H01L 51/0073; H01L 23/3128; H01L 2224/05599; H01L 51/0037; H01L 51/0058; H01L 24/48; H01L 24/73; H01L 31/022425; H01L 24/13; H01L 2924/0665; H01L 27/1225; H01L 2924/01006; H01L 2251/566; H01L 2924/01322; H01L 29/7926; H01L 51/0013; H01L 33/62; H01L 2224/13099; H01L 51/006; H01L 21/28273; H01L 25/105; H01L 33/486; H01L 51/0545; H01L 2225/1058; H01L 27/1214; H01L 27/14627; H01L 2224/05073; H01L 2224/05166; H01L 2224/05172; H01L 27/115; H01L 2924/07811; H01L 2924/15788; H01L 45/146; H01L 25/50; H01L 27/11556; H01L 33/32; H01L 27/11524; H01L 45/04; H01L 2224/48247; H01L 23/13; H01L 2924/01013; H01L 51/5072; H01L 2224/73267; H01L 27/14685; H01L 27/3281; H01L 51/5064; H01L 51/5221; H01L 21/28282; H01L 2224/13144; H01L 24/16; H01L 27/10855; H01L 27/3246; H01L 2924/01005; H01L 33/20; H01L 21/31144; H01L 2224/05552; H01L 2224/05647; H01L 2224/48465; H01L 27/11521; H01L 29/792; H01L 24/24; H01L 27/1248; H01L 27/3262; H01L 2924/01078; H01L 2924/01079; H01L 45/06; H01L 45/144; H01L 51/5092; H01L 2224/05155; H01L 2224/2919; H01L 2224/82; H01L 24/32; H01L 27/0207; H01L 27/1255; H01L 27/14621; H01L 29/66833; H01L 45/1233; H01L 51/0541; H01L 21/28562; H01L 2224/2929; H01L 2225/06517; H01L 24/05; H01L 51/504; H01L 2224/13147; H01L 2224/16227; H01L 2224/45099; H01L 2225/06513; H01L 24/11; H01L 27/10852; H01L 27/11573; H01L 29/66969; H01L 51/5256; H01L 2225/1023; H01L 23/49827; H01L 27/12; H01L 29/7827; H01L 51/5056; H01L 51/524; H01L 21/32139; H01L 21/76877; H01L 2224/05124; H01L 2251/5315; H01L 2251/558; H01L 23/5389; H01L 27/11565; H01L 2924/15331; H01L 51/0096; H01L 21/568; H01L 21/76897; H01L 2224/05644; H01L 24/82; H01L 27/105; H01L 27/1157; H01L 27/249; H01L 28/90; H01L 2924/01014; H01L 2924/01046; H01L 2924/0105; H01L 51/0036; H01L 51/0039; H01L 23/49811; H01L 27/11568; H01L 2924/01015; H01L 2924/01028; H01L 2924/14; H01L 29/78696; H01L 45/1226; H01L 51/50; H01L 51/5036; H01L 51/52; H01L 2224/05666; H01L 2224/13116; H01L 2224/97; H01L 24/45; H01L 24/81; H01L 2924/20752; H01L 2924/3011; H01L 2924/3025; H01L 29/66666; H01L 51/0097; H01L 51/5284; H01L 2224/04105; H01L 2224/05082; H01L 2224/13155; H01L 2224/451; H01L 2224/49175; H01L 2224/73215; H01L 2225/06565; H01L 2225/06568; H01L 27/10876; H01L 27/10885; H01L 27/1288; H01L 2924/01023; H01L 29/41733; H01L 29/42384; H01L 31/02366; H01L 51/0054; H01L 51/0061; H01L 51/0077; H01L 51/0558; H01L 51/5281; H01L 2251/5338; H01L 2251/556; H01L 23/49816; H01L 27/11526; H01L 29/42332; H01L 29/4234; H01L 51/5203; H01L 21/02532; H01L 21/563; H01L 2224/11; H01L 2224/13124; H01L 2224/48479; H01L 2225/0651; H01L 24/03; H01L 24/29; H01L 24/97; H01L 27/10891; H01L 27/11519; H01L 27/228; H01L 2924/0102; H01L 2924/01043; H01L 2924/12044; H01L 2924/20754; H01L 2924/20755; H01L 29/78606; H01L 29/78633; H01L 31/18; H01L 21/0337; H01L 2224/13025; H01L 2224/293; H01L 2225/06541; H01L 23/481; H01L 23/49822; H01L 23/5258; H01L 27/3272; H01L 2924/01019; H01L 2924/01027; H01L 29/513; H01L 29/66825; H01L 31/05; H01L 31/1804; H01L 33/58; H01L 51/0043; H01L 51/5265; H01L 51/5271; H01L 51/5275; H01L 21/76802; H01L 21/76843; H01L 21/78; H01L 2224/32245; H01L 2224/48471; H01L 2224/73253; H01L 23/48; H01L 24/83; H01L 27/0688; H01L 27/10888; H01L 27/11; H01L 27/11578; H01L 27/2436; H01L 2924/01032; H01L 2924/18161; H01L 51/5234; H01L 21/0262; H01L 21/3212; H01L 2224/05147; H01L 2224/12105; H01L 2224/13; H01L 2224/1369; H01L 2224/1379; H01L 2224/138; H01L 2224/245; H01L 2224/48095; H01L 2224/4824; H01L 2224/48624; H01L 2224/49107; H01L 2224/821; H01L 2224/95; H01L 2227/323; H01L 2251/5369; H01L 24/06; H01L 24/92; H01L 27/11575; H01L 27/322; H01L 2924/01042; H01L 2924/351; H01L 29/788; H01L 31/0224;
H01L 31/1085; H01L 31/1808; H01L
21/0242; H01L 21/28556; H01L 21/6835;
H01L 21/76846; H01L 2224/05099;
H01L 2224/05572; H01L 2224/13599;
H01L 2224/29099; H01L 2224/29599;
H01L 2224/92244; H01L 2225/06524;
H01L 2251/5346; H01L 2251/5384;
H01L 27/2409; H01L 27/3274; H01L
29/6659; H01L 33/22; H01L 43/08; H01L
51/0021; H01L 51/007; H01L 21/3122;
H01L 21/486; H01L 2224/13022; H01L
2224/48; H01L 2225/06562; H01L
23/49838; H01L 24/14; H01L 24/96;
H01L 2924/01011; H01L 2924/01012;
H01L 2924/01022; H01L 2933/0091;
H01L 29/78603; H01L 43/12; H01L
51/0009; H01L 51/0055; H01L 51/5024;
H01L 51/506; H01L 51/5096; H01L
51/521; H01L 51/5218; H01L 21/0237;
H01L 21/02422; H01L 21/0254; H01L
21/02554; H01L 21/02672; H01L
21/0274; H01L 21/76856; H01L
2224/05617; H01L 2224/0562; H01L
2224/05623; H01L 2224/05638; H01L
2224/05657; H01L 2224/05672; H01L
2224/13139; H01L 2224/29109; H01L
2224/29111; H01L 2224/29113; H01L
2224/29117; H01L 2224/29118; H01L
2224/2912; H01L 2224/29123; H01L
2224/29124; H01L 2224/29138; H01L
2224/29139; H01L 2224/29144; H01L
2224/29147; H01L 2224/29155; H01L
2224/29157; H01L 2224/2939; H01L
2224/73203; H01L 2224/82101; H01L
2224/96; H01L 2251/5323; H01L
23/5226; H01L 27/1266; H01L 27/32;
H01L 27/3248; H01L 2924/00011; H01L
2924/01024; H01L 2924/01057; H01L
2924/01083; H01L 2924/01084; H01L
2924/13055; H01L 2924/13091; H01L
2924/19041; H01L 2924/20751; H01L
2924/20753; H01L 2924/20756; H01L
2924/20757; H01L 2924/20758; H01L
2924/20759; H01L 2924/2076; H01L
29/4236; H01L 29/6656; H01L 29/66742;
H01L 31/068; H01L 33/06; H01L 33/38;
H01L 51/0003; H01L 51/003; H01L
21/02488; H01L 21/0273; H01L
21/26513; H01L 21/561; H01L 21/7684;
H01L 21/76898; H01L 2224/83191;
H01L 2224/83192; H01L 23/53238;
H01L 25/16; H01L 27/08; H01L
27/11546; H01L 27/1285; H01L 27/3267;
H01L 2924/01056; H01L 29/66621;
H01L 29/7833; H01L 31/02363; H01L
31/0682; H01L 33/505; H01L 33/54;
H01L 33/56; H01L 41/193; H01L
51/0004; H01L 51/009; H01L 51/105;
H01L 51/5052; H01L 21/02647; H01L
21/268; H01L 21/31053; H01L 21/31111;
H01L 2224/14181; H01L 2224/24227;
H01L 21/02565; H01L 2224/83; H01L
2224/83385; H01L 23/3135; H01L 24/12;
H01L 24/19; H01L 27/0629; H01L
27/10894; H01L 27/11548; H01L
27/14689; H01L 27/3265; H01L 27/3295;
H01L 2924/0103; H01L 2924/013; H01L
2924/12041; H01L 29/78; H01L 29/7834;
H01L 29/785; H01L 31/065; H01L
33/007; H01L 33/483; H01L 45/126;
H01L 45/147; H01L 51/0537; H01L
51/426; H01L 51/502; H01L 51/5206;
H01L 21/50; H01L 21/76852; H01L
21/76862; H01L 2224/0345; H01L
2224/03452; H01L 2224/04042; H01L
2224/05558; H01L 2224/1146; H01L
2224/11472; H01L 2224/11849; H01L
2224/1308; H01L 2224/13123; H01L
2224/13157; H01L 2224/13164; H01L
2224/13171; H01L 2224/13172; H01L
2224/24011; H01L 2224/24145; H01L
2224/24146; H01L 2224/29101; H01L
2224/29444; H01L 2224/45147; H01L
2224/48137; H01L 2224/4814; H01L
2224/48225; H01L 2224/73209; H01L
2224/81193; H01L 2224/85399; H01L
23/49575; H01L 23/562; H01L 24/27;
H01L 25/0652; H01L 25/18; H01L
27/101; H01L 27/14609; H01L 27/14643;
H01L 27/3258; H01L 28/91; H01L
2924/01004; H01L 2924/01045; H01L
2924/01075; H01L 2924/0132; H01L
21/02458; H01L 21/02628; H01L
2924/15787; H01L 2924/30111; H01L
29/518; H01L 29/665; H01L 41/113;
H01L 45/143; H01L 45/1675; H01L
51/0024; H01L 51/005; H01L 51/5262;
H01L 21/02667; H01L 21/0338; H01L
21/283; H01L 21/28518; H01L 21/31604;
H01L 21/76831; H01L 21/76838; H01L
2224/03912; H01L 2224/05548; H01L
2224/24226; H01L 2224/48237; H01L
2224/81191; H01L 2227/326; H01L
2251/305; H01L 23/3107; H01L 23/5222;
H01L 24/49; H01L 27/10829; H01L
27/11551; H01L 27/1203; H01L
27/14632; H01L 27/153; H01L 28/40;
H01L 2924/00015; H01L 2924/15151;
H01L 2924/15153; H01L 2924/15159;
H01L 2924/19042; H01L 2924/30107;
H01L 2924/3512; H01L 2933/0066;
H01L 29/42352; H01L 29/6653; H01L
29/786; H01L 29/7889; H01L 31/028;
H01L 31/0322; H01L 31/048; H01L
33/025; H01L 33/04; H01L 33/46; H01L
51/0001; H01L 51/0008; H01L 51/0012;
H01L 51/004; H01L 51/0042; H01L
51/0533; H01L 51/448; H01L 51/508;
H01L 21/02576; H01L 21/02631; H01L
21/0276; H01L 21/28123; H01L 21/3065;
H01L 21/3081; H01L 21/6715; H01L
21/67253; H01L 21/76864; H01L
21/823807; H01L 21/02579; H01L
51/30107; H01L 51/3512; H01L
2224/19042; G03F 7/0392; G03G
15/6564; G03G 15/6567; G03G
2221/1663; G03G 2221/183; G03G
2221/1884; G03G 9/081; G03G 9/08704;
G03G 9/08706; G03G 9/08708; G03G 9/08728; G03G 9/08786; G03G 9/08788; G03G 9/08791; G03G 9/0904; G03G 9/0918; G03G 9/09385; G03G 9/09328; G03G 9/0827; G03G 9/0825; G03G 9/0823; G03G 9/08; G03G 9/0806; G03G 2215/066; G03G 2215/0891; G03G 2215/0158; G03G 2215/0145; G03G 2215/0894; G03G 2215/00059; G03G 2215/00109; G03G 21/1604; G03G 21/1661; G03G 21/1846; G03G 21/186; G03G 21/105; G03G 21/1825; G03G 21/1642; G03G 21/00; G03G 21/10; G03G 21/12; G03G 21/1666; G03G 21/1671; G03G 21/1821; G03G 21/16; G03G 21/1647; G03G 21/1875; G03G 15/043; G03G 15/0812; G03G 15/0875; G03G 15/556; G03G 15/80; G03G 15/553; G03G 15/55; G03G 15/5079; G03G 15/0886; G03G 15/0877; G03G 15/605; G03G 15/5054; G03G 15/0862; G03G 15/0834; G03G 15/0831; G03G 15/0818; G03G 15/0808; G03G 15/0131; G03G 2215/00421; G03G 9/08797; G03G 2221/1657; G03G 2221/1846; G03G 2221/169; G03G 2221/0089; G03G 21/1842; G03G 21/1853; G03G 21/1857; G03G 21/203; G03G 9/09371; G03G 15/2017; G03G 15/326; G03G 15/6552; G03G 21/18; G03G 15/5058; G03G 15/5066; G03G 15/5075; G03G 9/08782; G03G 2221/163; G03G 9/08755; G03G 9/09716; G03G 15/0233; G03G 15/0865; G03G 15/0868

See application file for complete search history.

(56) References Cited

U.S. PATENT DOCUMENTS

| | | | |
|---|---|---|---|
| 6,653,047 | B2 | 11/2003 | Lee et al. |
| 6,806,025 | B2 | 10/2004 | Lee et al. |
| 7,192,686 | B2 | 3/2007 | Meagley |
| 7,691,558 | B2 | 4/2010 | Wada |
| 8,039,194 | B2 | 10/2011 | Glodde |
| 8,114,570 | B2 | 2/2012 | Ohsawa et al. |
| 8,114,571 | B2 | 2/2012 | Ohashi et al. |
| 8,192,590 | B1 | 6/2012 | Belfield et al. |
| 8,637,220 | B2 | 1/2014 | Tsuchimura et al. |
| 8,652,712 | B2 | 2/2014 | Glodde |
| 8,795,943 | B2 | 8/2014 | Park et al. |
| 2011/0143099 | A1* | 6/2011 | Glodde .......... C07C 25/18 428/172 |
| 2011/0274853 | A1* | 11/2011 | Park .......... G03F 7/0045 427/595 |
| 2012/0003583 | A1* | 1/2012 | Tsuchimura .......... G03F 7/0045 430/283.1 |
| 2013/0344439 | A1 | 12/2013 | Liu et al. |

FOREIGN PATENT DOCUMENTS

| | | |
|---|---|---|
| JP | 2008-266495 | 11/2008 |
| KR | 10-2012-0121585 | 11/2012 |
| KR | 10-1361623 B1 | 2/2014 |

* cited by examiner

METHODS OF FORMING PATTERNS USING PHOTORESIST POLYMERS

CROSS-REFERENCE TO RELATED APPLICATION

This application claims priority under 35 USC §119 to Korean Patent Application No. 10-2014-0167424, filed on Nov. 27, 2014, the contents of which are incorporated by reference herein in their entirety.

FIELD

Example embodiments relate to photoresist polymers, photoresist compositions, methods of forming patterns and methods of manufacturing semiconductor devices. More particularly, example embodiments relate to photoresist polymers including different repeating units, photoresist compositions including the photoresist polymers, and methods of forming patterns and methods of manufacturing semiconductor devices using the photoresist polymers.

BACKGROUND

A photolithography process may be utilized for a formation of various patterns included in a semiconductor device. For example, a photoresist layer may be divided into an exposed portion and a non-exposed portion by, e.g., an exposure process, and the exposed portion may be removed by a developing process to form a photoresist pattern. The object layer may be patterned using the photoresist pattern as an etching mask to form a desired pattern.

However, an intermediate component such as an acid may be generated from the exposure process, and a resolution of the photolithography process may be deteriorated by the intermediate.

SUMMARY

Example embodiments of the present inventive concepts provide a photoresist polymer having an improved resolution.

Example embodiments of the present inventive concepts provide a photoresist composition including a photoresist polymer of the present inventive concepts.

Example embodiments of the present inventive concepts provide a method of forming a pattern using a photoresist polymer of the present inventive concepts.

Example embodiments of the present inventive concepts provide a method of manufacturing a semiconductor device using a photoresist polymer of the present inventive concepts.

According to example embodiments of the present inventive concepts, there is provided a photoresist polymer. The photoresist polymer includes a first repeating unit including a halogen donor group, and a second repeating unit including a protecting group connected by a sulfide bond.

In example embodiments, the halogen donor group may include a heterocyclic compound having a nitrogen-halogen bond.

In example embodiments, the halogen donor group may include at least one of N-iodosuccinimide (NIS), N-bromosuccinimide (NBS), N-chlorosuccinimide (NCS), N-iodophthalimide (NIPI), N-bromophthalimide (NBPI) and N-chlorophthalimide (NCPI).

In example embodiments, the polymer may include a structure that is represented by Chemical Formula 1 or Chemical Formula 2.

[Chemical Formula 1]

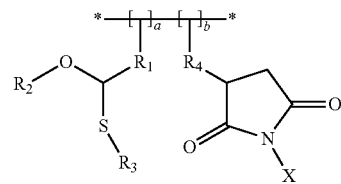

[Chemical Formula 2]

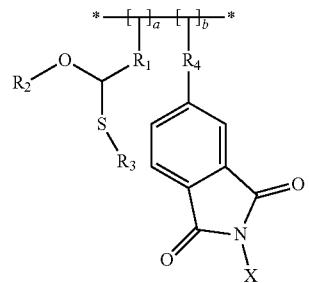

In Chemical Formulae 1 and 2, $R_1$ and $R_4$ may be independently a divalent group selected from styrene, hydroxystyrene, acrylate, $C_1$-$C_6$ alkylene, arylene, carbonyl, oxy, $C_6$-$C_{30}$ aliphatic ester, $C_6$-$C_{30}$ unsaturated aliphatic group or a combination thereof. $R_2$ may be hydrogen or a $C_1$-$C_{20}$ alkyl group. $R_3$ may be a $C_6$-$C_{30}$ aromatic group or a $C_1$-$C_{20}$ alkyl group. X may represent chlorine (Cl), bromine (Br) or iodine (I). Each a and b may represent a mole ratio ranging from about 0.4 to about 0.6, and a sum of a and b may be 1.

In example embodiments, the polymer may include a structure that is represented by Chemical Formula 3 or Chemical Formula 4.

[Chemical Formula 3]

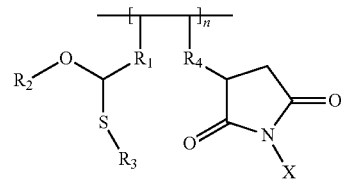

[Chemical Formula 4]

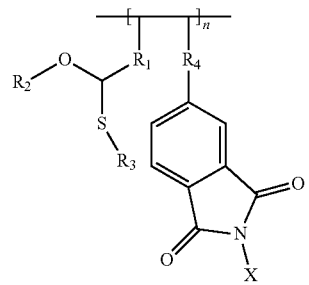

In Chemical Formulae 3 and 4, n may be an integer ranging from 100 to 10,000.

According to example embodiments of the present inventive concepts, there is provided a photoresist composition. The photoresist composition includes a polymer in which a first repeating unit including a halogen donor group and a second repeating unit including a protecting group connected by a sulfide bond are polymerized, and a solvent.

In example embodiments, the polymer may include a structure that is represented by the above Chemical Formula 1 or Chemical Formula 2.

In example embodiments, the photoresist composition may further include a photoacid generator.

According to example embodiments of the present inventive concepts, there is provided a method of forming a pattern. In the method, a photoresist layer is formed on an object layer. The photoresist layer includes a polymer in which a first repeating unit including a halogen donor group and a second repeating unit including a protecting group connected by a sulfide bond are polymerized. An exposure process is performed on the photoresist layer such that the photoresist layer is divided into an exposed portion and a non-exposed portion. The exposed portion of the photoresist layer is removed to form a photoresist pattern.

In example embodiments, a halonium ion or a halogen radical may be generated from the halogen donor group by the exposure process.

In example embodiments, the protecting group may be separated from the second repeating unit by the halonium ion or the halogen radical.

In example embodiments, the exposure process may be performed by a light source including ArF, KrF, an electron beam, I-line and/or extreme ultraviolet (EUV).

In example embodiments, the photoresist layer may be formed by coating a photoresist composition on the object layer. The photoresist composition may include the polymer, a solvent and a photoacid generator.

In example embodiments, a proton (H$^+$) generated from the photoacid generator may be trapped by the halogen donor group.

In example embodiments, the halogen donor group may include a nitrogen-halogen bond and a carbonyl bond. The proton may be trapped by the carbonyl bond so that a halonium ion may be generated from the nitrogen-halogen bond.

In example embodiments, the exposed portion may be more hydrophilic than the non-exposed portion.

In example embodiments, the exposed portion may include an acetal structure to which a hydroxyl group may be combined.

In example embodiments, the exposed portion may be selectively removed using a developing solution.

In example embodiments, the polymer may be represented by a structure as provided by above Chemical Formula 1 or Chemical Formula 2.

In example embodiments, the object layer may be patterned using the photoresist pattern as an etching mask.

According to example embodiments of the present inventive concepts, there is provided a method of forming a pattern. In the method, a photoresist layer is formed on an object layer. The photoresist layer includes a polymer in which a first unit including a nitrogen-halogen bond and a second unit including a sulfide bond are alternately polymerized. A selective exposure process is performed on the photoresist layer so that an active halogen is generated from the nitrogen-halogen bond, and the active halogen is transferred to the sulfide bond. An exposed portion of the photoresist layer is removed to form a photoresist pattern.

In example embodiments, the first unit may include N-iodosuccinimide (NIS), N-bromosuccinimide (NBS), N-chlorosuccinimide (NCS), N-iodophthalimide (NIPI), N-bromophthalimide (NBPI) and/or N-chlorophthalimide (NCPI).

In example embodiments, the second unit may have a structure that is be represented by Chemical Formula 5.

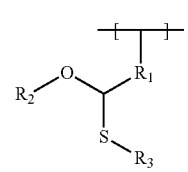

[Chemical Formula 5]

In Chemical Formula 5, $R_1$ may be a divalent group including styrene, hydroxystyrene, acrylate, $C_1$-$C_6$ alkylene, arylene, carbonyl, oxy, $C_6$-$C_{30}$ aliphatic ester, $C_6$-$C_{30}$ unsaturated aliphatic group or a combination thereof. $R_2$ may be hydrogen or a $C_1$-$C_{20}$ alkyl group. $R_3$ may be a $C_6$-$C_{30}$ aromatic group or a $C_1$-$C_{20}$ alkyl group.

In example embodiments, —$SR_3$ included in the second unit may be separated from the second unit by the active halogen.

In example embodiments, the exposed portion may be converted to a hydrophilic pattern.

According to example embodiments of the present inventive concepts, there is provided a method of manufacturing a semiconductor device. In the method, a plurality of active patterns defined by an isolation layer is formed on a substrate. A gate structure is formed on at least one of the plurality of active patterns. An impurity region is formed at an upper portion of the at least one active pattern adjacent to the gate structure. An insulating interlayer covering the isolation layer and the at least one active pattern is formed. A photoresist layer is formed on the insulating interlayer. The photoresist layer includes a polymer in which a first repeating unit including a halogen donor group, and a second repeating unit including a protecting group connected by a sulfide bond are polymerized. An exposure process is performed on the photoresist layer such that the photoresist layer is divided into an exposed portion and a non-exposed portion. The exposed portion of the photoresist layer is removed to form a photoresist pattern. The insulating interlayer is partially removed using the photoresist pattern as an etching mask to form a contact hole through which the impurity region is exposed. A conductive contact electrically connected to the impurity region is formed in the contact hole.

In example embodiments, the gate structure may be at least partially buried in the plurality of active patterns and the isolation layer.

In example embodiments, in the formation of the impurity region, a first impurity region may be formed between the gate structures, and a second impurity region may be formed at a peripheral portion of the at least one active pattern. The second impurity region may be exposed through the contact hole.

In example embodiments, a capacitor may be further formed on the conductive contact.

In example embodiments, the polymer may have a structure that is be represented by the above Chemical Formula 1 or Chemical Formula 2.

According to example embodiments of the present inventive concepts, there is provided a method of forming a pattern, the method comprising forming a photoresist layer on an object layer, the photoresist layer including a polymer that comprises a first repeating unit including a halogen donor group, and a second repeating unit including a protecting group connected by a sulfide bond; generating a halonium ion or a halogen radical from a first repeating unit of the polymer; and removing the protecting group from a second repeating unit of the polymer.

The first repeating unit of the polymer may include a heterocyclic compound having a nitrogen-halogen bond. In some embodiments, the first repeating unit of the photoresist polymer may include at least one moiety selected from N-iodosuccinimide (NIS), N-bromosuccinimide (NBS), N-chlorosuccinimide (NCS), N-iodophthalimide (NIPI), N-bromophthalimide (NBPI) and N-chlorophthalimide (NCPI).

In some embodiments, the polymer may include a structure that is represented by Chemical Formula 1 or Chemical Formula 2 as provided above. In some embodiments, the polymer may include a structure that is represented by Chemical Formula 3 or Chemical Formula 4.

In some embodiments, the halonium ion or the halogen radical may react with a sulfur atom in the sulfide bond to remove the protecting group from the second repeating unit of the polymer.

In some embodiments, the protecting group from the second repeating unit of the polymer may be replaced with a hydroxyl group.

BRIEF DESCRIPTION OF THE DRAWINGS

The above and other aspects, features and advantages of the present inventive concepts will become more apparent in view of the attached drawings and accompanying detailed description. The drawings provided herein represent non-limiting, example embodiments according to various embodiments of the present inventive concepts.

DESCRIPTION OF EMBODIMENTS

Figure 1:
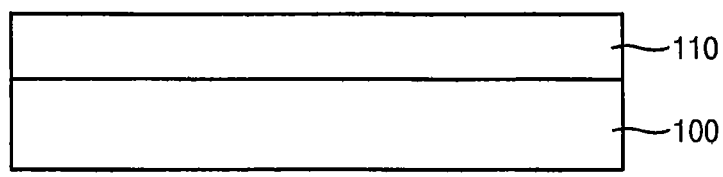
FIGS. 1 to 6 are cross-sectional views illustrating a method of forming a pattern according to various embodiments of the present inventive concepts.

Various example embodiments are described below with reference to the accompanying drawings, in which some example embodiments are shown. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the disclosure.

The terminology used herein is for the purpose of describing particular example embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper," and the like, may be used herein for ease of disclosure to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the present inventive concepts are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing. For example, an implanted region illustrated as a rectangle may actually have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which these present inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Photoresist Polymers

A photoresist polymer in accordance with example embodiments may include a first repeating unit and a second repeating unit that may be alternately and repeatedly propagated in a backbone chain.

The backbone chain may include a carbon chain, which may be included in a photoresist material. For example, the backbone chain may include a polymer chain such as novolak, polystyrene, polyhydroxystyrene (PHS), polyacrylate, polymethacrylate, polyvinyl ester, polyvinyl ether, polyolefin, polynorbornene, polyester, polyamide, polycarbonate or the like. In some embodiments, novolak, polystyrene, PHS or polyacrylate may be used as the backbone chain.

The first repeating unit may include a halogen donor group.

In example embodiments, the halogen donor group may include a nitrogen-halogen bond having a high photochemical reactivity. For example, the nitrogen-halogen bond may be decomposed by an ultraviolet (UV) exposure process so that an active halogen such as a halonium ion or a halogen radical may be generated from the halogen donor group.

In some embodiments, the halogen donor group may include a heterocyclic compound containing nitrogen. For example, the halogen donor group may include N-iodosuccinimide (NIS), N-bromosuccinimide (NBS), N-chlorosuccinimide (NCS), N-iodophthalimide (NIPI), N-bromophthalimide (NBPI) or N-chlorophthalimide (NCPI). Thus, the photoresist polymer may include at least one moiety selected from NIS, NBS, NCS, NIPI, NBPI, and NCPI. "Moiety" or "moieties," as used herein, refer to a portion of a molecule, such as a portion of a polymer, typically having a particular functional or structural feature. For example, a moiety may include a functional group off a backbone chain of a polymer and/or a functional group that is part of a side chain of polymer.

In example embodiments, the second repeating unit may include a protecting group connected by a sulfide bond. Thus, the protecting group may be attached to the second repeating unit of the photoresist polymer via a sulfide bond. The active halogen separated from the first repeating unit may be transferred to a neighboring second repeating unit. Accordingly, the sulfide bond may be dissociated so that the protecting group may be separated from the second repeating unit.

In some embodiments, the photoresist polymer may include a structure represented by Chemical Formula 1 or Chemical Formula 2.

[Chemical Formula 1]

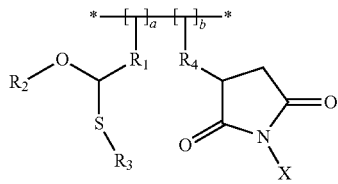

[Chemical Formula 2]

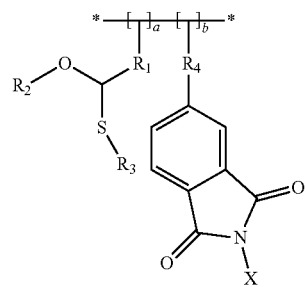

In Chemical Formulae 1 and 2, $R_1$ and $R_4$ may each independently be a divalent group selected from styrene, hydroxystyrene, acrylate, $C_1$-$C_6$ alkylene, arylene, carbonyl, oxy, $C_6$-$C_{30}$ aliphatic ester, $C_6$-$C_{30}$ unsaturated aliphatic group or a combination thereof. $R_1$ and $R_4$ may be the same as or different from each other. In some embodiments, $R_1$ and/or $R_4$ in one repeating unit may be the same as or different from $R_1$ and/or $R_4$ in another repeating unit. $R_2$ may be hydrogen or a $C_1$-$C_{20}$ alkyl group, and $R_3$ may be a $C_6$-$C_{30}$ aromatic group or a $C_1$-$C_{20}$ alkyl group. X may represent chlorine (Cl), bromine (Br) or iodine (I). Each a and b may represent a mole ratio. In some embodiments, each a and b may be in a range of about 0.4 to about 0.6, and a sum of a and b may be 1.

In the above Chemical Formulae 1 and 2, a right unit represented by "b" may correspond to the first repeating unit, and a left unit represented by "a" may correspond to the second repeating unit.

In some embodiments, the first and second repeating units may be alternately repeated in the backbone chain. In this case, the first and second repeating units may be combined in a ratio of 1:1 to form one polymerized repeating unit, and the polymerized repeating units may be repeated in the backbone chain.

Accordingly, the photoresist polymer chain may include a structure represented by the following Chemical Formula 3 or Chemical Formula 4.

[Chemical Formula 3]

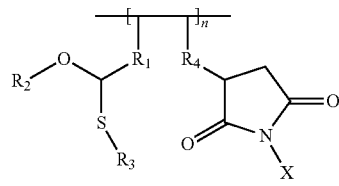

[Chemical Formula 4]

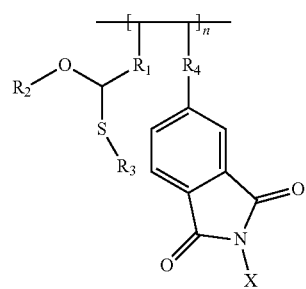

In some embodiments, in Chemical Formulae 3 and/or 4, n may be an integer in a range of 100 to 10,000.

As described above, the active halogen such as a halonium ion (X$^+$) or a halogen radical (X.) may be generated from an imide nitrogen of the halogen donor group included in the first repeating unit. The active halogen may attack a sulfur atom present in the second repeating unit so that the protecting group (—SR$_3$) may be separated from the second unit. A site from which the protecting group is removed may be replaced with a hydroxyl group. Thus, a portion of the photoresist polymer from which the protecting group is separated or removed may be substantially hydrophilic.

In example embodiments, the photoresist polymer may be utilized as a positive type photoresist material. In this case, a portion of the photoresist polymer from which the protecting group is separated may be removed by a developing solution.

Photoresist Compositions

A photoresist composition in accordance with example embodiments may include a photoresist polymer of the present inventive concepts and a solvent.

As described above, the photoresist polymer may include a first repeating unit containing a halogen donor group and a second repeating unit containing a protecting group connected by a sulfide bond, which may be repeated in a backbone chain.

In some embodiments, the photoresist polymer may have a structure that may be represented by the above-mentioned Chemical Formula 1 or Chemical Formula 2. In some embodiment, the photoresist polymer may have a structure that may be represented by the above-mentioned Chemical Formula 3 or Chemical Formula 4.

The solvent may include an organic solvent having a solubility suitable for a polymer material, and a coatability suitable for a formation of a uniform photoresist layer. Example solvents may include, but are not limited to, cyclohexanone, cyclopentanone, tetrahydrofuran (THF), dimethylformamide, propylene glycol monomethyl ether acetate (PGMEA), ethyl lactate, methyl ethyl ketone, benzene or toluene. These may be used alone or in combination. In some embodiments, 1, 2, 3, 4, or more solvent(s) may be present in a photoresist composition.

In example embodiments, the photoresist composition may include a positive type photoresist. For example, a photoresist layer may be formed using the photoresist composition, and an exposure process may be performed on the photoresist layer. A polymer structure of an exposed portion may be modified to have a hydrophilicity and/or a solubility greater than those of a non-exposed portion. The exposed portion may be removed by a developing solution so that a photoresist pattern may be obtained.

An active halogen may be generated from the halogen donor group in the exposed portion, and the sulfide bond contained in the second repeating unit of the exposed portion may be dissociated by the active halogen so that the protecting group may be departed or removed from the second repeating unit. Accordingly, the hydrophilicity and/or the solubility of the exposed portion may be increased.

In some embodiments, the photoresist composition may further include a photoacid generator (PAG). A proton (H$^+$) generated from the PAG may be trapped by the halogen donor group. As a result, a halonium ion (X$^+$) may be created from a nitrogen-halogen bond so that the protecting group of the second repeating unit may be separated or removed. In this case, the PAG may serve as a catalyst for creating the halonium ion.

The PAG may include, any compounds capable of generating an acid by an exposure process. For example, the PAG may include, but is not limited to, an onium salt, an aromatic diazonium salt, a sulfonium salt, a triarylsulfonium salt, a diarylsulfonium salt, a monoarylsulfonium salt, an iodonium salt, a diaryliodonium salt, nitrobenzyl ester, disulfone, diazo-disulfone, sulfonate, trichloromethyl triazine, N-hydroxysuccinimide triflate, or the like. These may be used alone or in combination. In some embodiments, 1, 2, 3, 4, or more PAG(s) may be present in a photoresist composition.

In some embodiments, the active halogen may be created only through a photochemical reaction by an exposure process without using a PAG. In this case, the active halogen may include a halogen radical. In some embodiments, the photoresist composition may further include a sensitizer for facilitating the photochemical reaction. An amount of photons may be amplified by the sensitizer, and thus a sufficient amount of the active halogen may be obtained.

Example sensitizers include, but are not limited to, benzophenone, benzoyl, thiophene, naphthalene, anthracene, phenanthrene, pyrene, coumarin, thioxantone, acetophenone, naphtoquinone, anthraquinone, or the like. These may be used alone or in combination. In some embodiments, 1, 2, 3, 4, or more sensitizers(s) may be present in a photoresist composition.

The photoresist composition may further include an additive for improving chemical and/or physical properties of the composition. The additive may include, e.g., a leveling agent, a viscosity modifier, a surfactant, and/or the like. In some embodiments, 1, 2, 3, 4, or more additive(s) may be present in a photoresist composition.

Methods of Forming Patterns

FIGS. 1 to 6 are cross-sectional views illustrating a method of forming/a pattern in accordance with example embodiments of the present inventive concepts. For example, FIGS. 1 to 6 illustrate the method of forming patterns utilizing a photoresist polymer or photoresist composition of the present inventive concepts.

Referring to FIG. 1, an object layer 110 may be formed on a substrate 100. The substrate 100 may include a silicon substrate, a germanium substrate, a silicon-germanium substrate, a silicon-on-insulator (SOI) substrate or a germanium-on-insulator (GOI) substrate. In some embodiments, the substrate 100 may include a group III-V compound such as GaP, GaAs or GaSb.

An image may be transferred from a photoresist pattern to the object layer 110 so that the object layer 110 may be converted to a predetermined pattern. In some embodiments, the object layer 110 may be formed of an insulative material such as silicon oxide, silicon nitride or silicon oxynitride. In some embodiments, the object layer 110 may be formed of a conductive material such as a metal, a metal nitride, a metal silicide or a metal silicide nitride. In some embodiments, the object layer 110 may be formed of a semiconductor material such as polysilicon.

The object layer 110 may be formed by at least one process of a chemical vapor deposition (CVD) process, a plasma enhanced chemical vapor deposition (PECVD) process, a low pressure chemical vapor deposition (LPCVD) process, a high density plasma chemical vapor deposition (HDP-CVD) process, a spin coating process, a sputtering process, an atomic layer deposition (ALD) process, and a physical vapor deposition (PVD) process.

Figure 2:
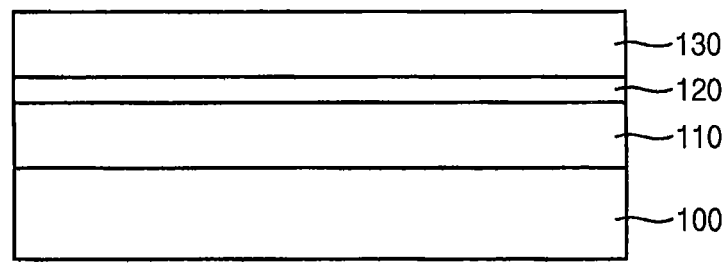

Referring to FIG. 2, an anti-reflective layer 120 and a photoresist layer 130 may be sequentially formed on the object layer 110.

The anti-reflective layer 120 may be formed using an aromatic organic composition such as a phenol resin or a novolak resin, or an inorganic material such as silicon oxynitride. The anti-reflective layer 120 may be formed by, e.g., a spin coating process, a dip coating process or a spray coating process. The anti-reflective layer 120 may also serve as a planarization layer. In some embodiments, formation of the anti-reflective layer 120 may be omitted.

The photoresist layer 130 may be formed using a photoresist composition according to the present inventive concepts. As described above, the photoresist composition may include a photoresist polymer and a solvent. The photoresist polymer may include a first repeating unit containing a halogen donor group and a second repeating unit containing a protecting group connected by a sulfide bond, which may be repeated in the backbone chain of the photoresist polymer. The photoresist composition may optionally include a PAG. In some embodiments, the photoresist composition may optionally include a sensitizer.

In some embodiments, a first repeating unit including a nitrogen-halogen bond, and a second repeating unit including a sulfide bond may be alternately polymerized to form the photoresist polymer.

For example, the first unit may include NIS, NBS, NCS, NIPI, NBPI or NCPI.

The second unit may be represented by the following Chemical Formula 5.

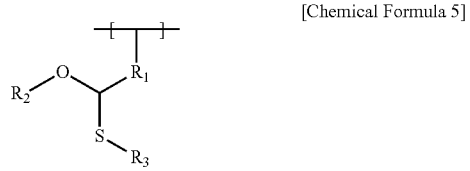

[Chemical Formula 5]

In Chemical Formula 5, $R_1$, $R_2$ and $R_3$ may be substantially the same as those defined in the above Chemical Formulae 1 to 4.

In some embodiments, the photoresist polymer may have a structure that may be represented by the above Chemical Formula 1 or Chemical Formula 2. In an embodiment, the photoresist polymer may have a structure that may be represented by the above Chemical Formula 3 or Chemical Formula 4.

The photoresist layer 130 may be formed by, e.g., a spin coating process, a dip coating process or a spray coating process. In some embodiments, the photoresist composition may be coated to form a preliminary photoresist layer, and the preliminary photoresist layer may be cured by, e.g., a baking process to form the photoresist layer 130.

Figure 3:
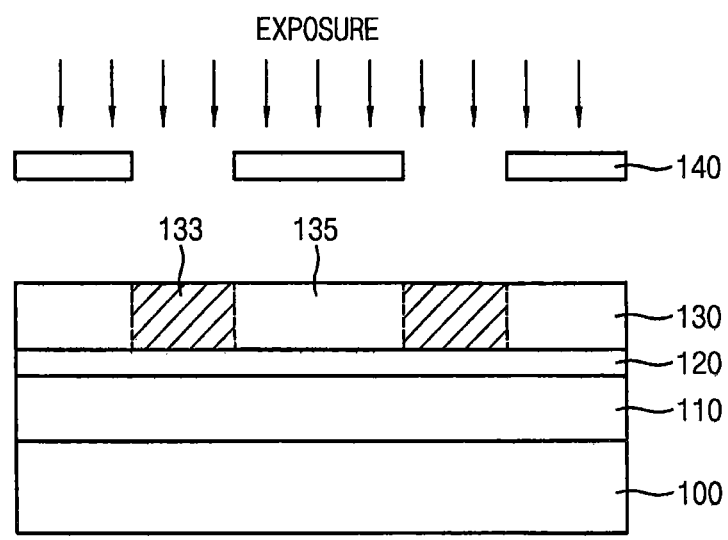

Referring to FIG. 3, an exposure process may be performed on the photoresist layer 130.

In some embodiments, an exposure mask 140 may be placed on the photoresist layer 130, and a light may be irradiated through an opening or a transmission portion included in the exposure mask 140. Non-limiting examples of a light source used in the exposure process may include ArF, KrF, an electron beam, I-line or extreme ultraviolet (EUV).

The photoresist layer 130 may be divided into an exposed portion 133 and a non-exposed portion 135. In some embodiments, a chemical structure in the exposed portion 133 may be modified through a mechanism shown by the following Reaction Scheme 1 or Reaction Scheme 2.

For example, according to Reaction Scheme 1, the PAG may be included in the photoresist composition. NIS may be used as the halogen donor group of the first repeating unit, and $R_3$ of the second repeating unit (see Chemical Formulae 1 to 5) may be a benzene group.

[Reaction Scheme 1]

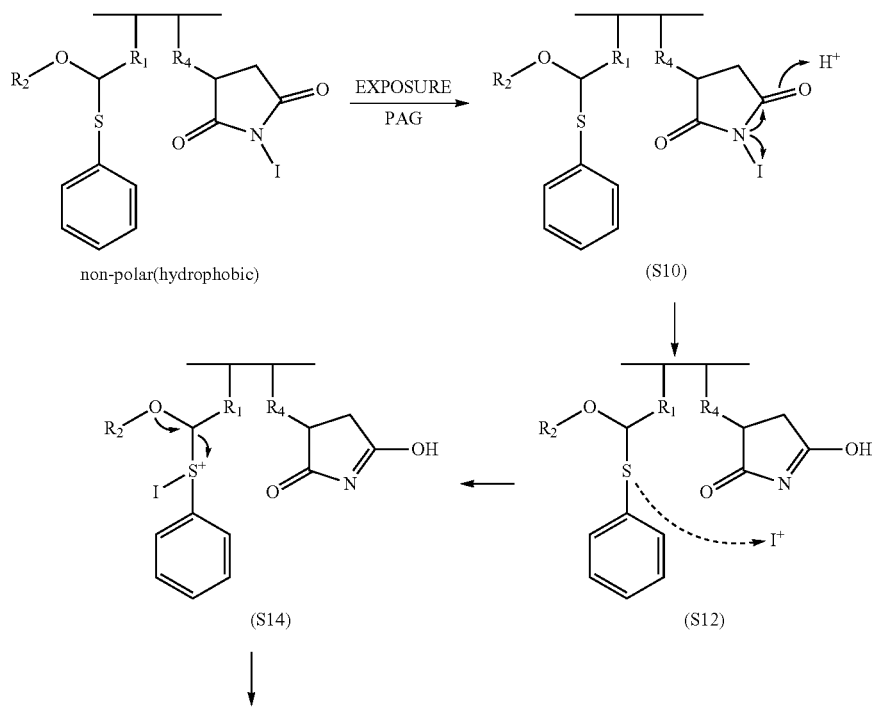

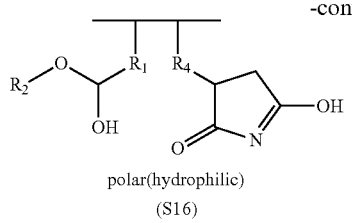

polar(hydrophilic)
(S16)

Referring to Reaction Scheme 1, the photoresist layer 130 may be substantially non-polar and/or hydrophobic before an exposure process. In operation S10, the exposure process may be initiated in the presence of a PAG, and a proton (i.e., an acid, $H^+$) may be generated from the PAG in the exposed portion 133. The proton may be trapped by NIS which serves as the halogen donor group of the first repeating unit. Thus, the proton may not diffuse into the non-exposed portion 135.

For example, the proton may be combined with a carbonyl oxygen of NIS so that iodine (I) may be separated from a nitrogen atom of NIS. Thus, the proton may react with a halogen donor group present in the exposed portion 133 such that the proton is not available to diffuse into the non-exposed portion 135.

Accordingly, in operation S12, an iodine cation as a halonium ion may be generated from the halogen donor group. The iodine cation may be transferred to the neighboring second repeating unit. The transferred iodine cation may be combined with a sulfur atom included in the protecting group of the second repeating unit.

In operation S14, after the combination of the sulfur atom and the iodine cation, a positive charge may be created at the sulfur atom, and an unshared electron pair in an adjacent oxygen atom may be moved so that dissociation of the sulfide bond may be initiated.

In operation S16, the sulfide bond may be completely dissociated so that the protecting group may be separated from the second repeating unit. In some embodiments, a hydroxyl group may be combined at a site from which the protecting group is removed. The hydroxyl group may be provided from, e.g., the solvent of the photoresist composition or a developing solution used in a subsequent developing process.

Accordingly, the second repeating unit in the exposed portion 133 may be modified to include, e.g., an acetal structure, and the first repeating unit may also be modified to include a hydroxyl group. Therefore, the exposed portion 133 may be converted to a pattern which may be polar and/or hydrophilic.

According to the mechanism described with reference to Reaction Scheme 1, the proton or the acid generated from the PAG may be trapped in the first repeating unit, and may only serve as a catalyst for the generation of a halonium ion. Thus, the proton or the acid may not diffuse into the non-exposed portion 135. Additionally, a halonium ion created from the first repeating unit may be reacted with the sulfide bond in the second repeating unit substantially in a ratio of 1:1. Thus, the halonium ion may not be diffused into the non-exposed portion 135, and may be selectively reacted in the exposed portion 133.

The halonium ion may have a relatively large dimension, and thus may be relatively free from diffusing into the non-exposed portion 135.

For example, according to Reaction Scheme 2, PAG may be excluded from the photoresist composition. NIS may be used as the halogen donor group in the first repeating unit, and $R_3$ of the second repeating unit (see Chemical Formulae 1 to 5) may be a benzene group.

[Reaction Scheme 2]

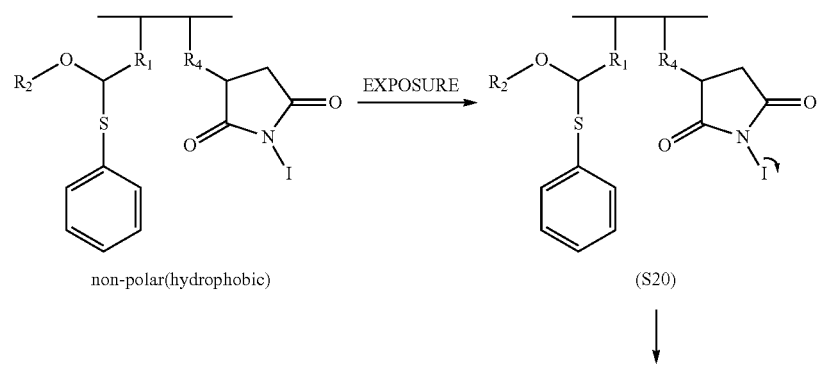

non-polar(hydrophobic)   (S20)

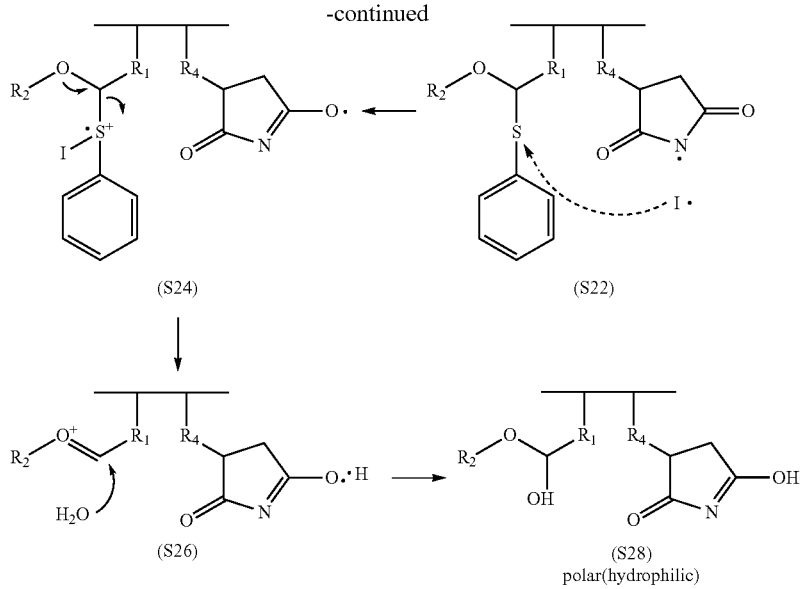

(S24) (S22) (S26) (S28) polar(hydrophilic)

Referring to Reaction Scheme 2, the photoresist layer 130 may be substantially non-polar and/or hydrophobic before an exposure process.

For example, when the exposure process may be initiated using an EUV source, a photochemical reaction may occur by photons in operation S20 so that a nitrogen-iodine bond included in NIS (i.e., the halogen donor group) may be dissociated.

In some embodiments, the photoresist composition may include a sensitizer. Thus, an amount or the number of the photons produced by the exposure process may be increased.

As the nitrogen-iodine bond is dissociated, an iodine radical may be created from NIS in operation S22. A nitrogen atom in NIS may be also radicalized. The iodine radical may be transferred to the neighboring second repeating unit. The transferred iodine radical may attack a sulfur atom included in the protecting group of the second repeating unit.

In operation S24, after combination of the sulfur atom and the iodine radical, the sulfur atom may be radicalized to form a positive charge, and an unshared electron pair included in an adjacent oxygen atom may be moved so that dissociation of the sulfide bond may be initiated. Further, a double bond may be created by an electron transfer between the nitrogen and carbonyl oxygen included in NIS so that carbonyl oxygen may be radicalized.

In operation S26, the sulfide bond may be completely dissociated so that the protecting group may be separated from the second repeating unit, and a double bond may be created at a site from which the protecting group is removed. A water molecule included in the solvent of the photoresist composition or the developing solution may be combined at the site.

In operation S28, the second repeating unit of the exposed portion 133 may be modified to include, e.g., an acetal structure, and the first repeating unit may also be modified to include a hydroxyl group. Therefore, the exposed portion 133 may be converted to a pattern which may be polar or hydrophilic.

According to the mechanism described with reference to Reaction Scheme 2, the reaction between the first and second repeating units may be derived only through the exposure process without the involvement of a PAG. Thus, an exposure process that may be completely free of an acid diffusion or a proton diffusion may be realized.

Figure 4:
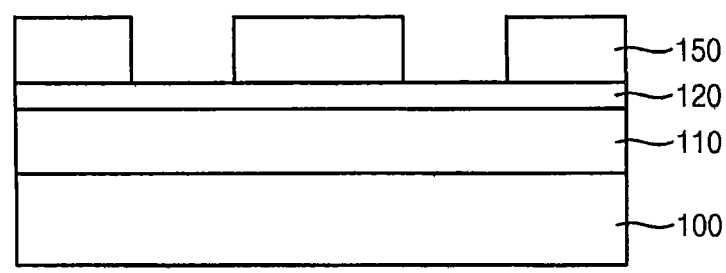

Referring to FIG. 4, the exposed portion 133 of the photoresist layer 130 may be selectively removed by, e.g., a developing process. Accordingly, a photoresist pattern 150 may be defined by the non-exposed portion 135 remaining on the object layer 110 and/or the anti-reflective layer 120.

For example, an alcohol-based solution or a hydroxide-based solution such as tetra methyl ammonium hydroxide (TMAH) may be used as the developing solution. As described above, the exposed portion 133 may be converted to a pattern which may be polar or hydrophilic relative to the non-exposed portion 135. Therefore, the exposed portion 133 may be selectively removed by a developing solution such as TMAH.

In a comparative example, while performing an exposure process in which a chemically amplified resist (CAR) system using a PAG is implemented, an acid may diffuse into the non-exposed portion 135 and increase a surface roughness of the photoresist pattern 150. The non-exposed portion 135 may also be damaged by the acid, and thus the photoresist pattern 150 having desired width and/or pitch may not be obtained. As a critical dimension of the photoresist pattern 150 or a target pattern formed by a photolithography process is decreased, a pattern damage by the acid diffusion may be exacerbated.

According to example embodiments, acid from a PAG may be excluded. In some embodiments, acid from the PAG may be trapped by the halogen donor group included in the exposed portion 133, and may only serve as a catalyst for generating the halonium ion. Thus, polar and/or hydrophilic properties of the exposed portion 133 may be achieved substantially only by a reaction between an active halogen and the protecting group. Therefore, a photolithography process system which may be substantially free of pattern damage caused by an irregular acid diffusion may be realized. Further, a photoresist pattern 150 and a target pattern having a desired fine width and/or pitch may be precisely formed.

Figure 5:
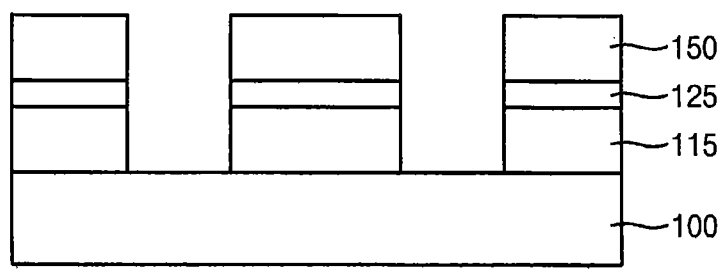

Referring to FIG. 5, the anti-reflective layer 120 and the object layer 110 may be etched using the photoresist pattern 150 as an etching mask. Accordingly, an anti-reflective layer pattern 125 and an object layer pattern 115 may be formed between the photoresist pattern 150 and the substrate 100.

The etching process may include a dry etching process or a wet etching process properly selected in consideration of an etching selectivity between the photoresist pattern 150 and the object layer 110.

In some embodiments, the dry etching process may include a plasma etching process.

In some embodiments, a proper etchant solution such as fluoric acid, phosphoric acid, sulfuric acid or peroxide may be selected depending on a material included in the object layer 110.

Figure 6:
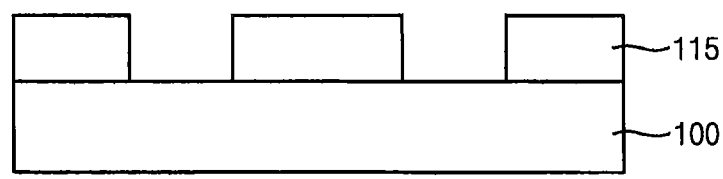

Referring to FIG. 6, the photoresist pattern 150 and the anti-reflective layer pattern 125 may be removed such that the object layer pattern 115 may remain on the substrate 100.

In some embodiments, the photoresist pattern 150 and the anti-reflective layer pattern 125 may be removed by an ashing process and/or a strip process. In some embodiments, the photoresist pattern 150 and the anti-reflective layer pattern 125 may be removed by a planarization process, e.g., a chemical mechanical polish (CMP) process.

If the object layer 110 includes a conductive material, the object layer pattern 115 may serve as a wiring, a contact, a pad, a plug, an interconnection structure, or the like of a semiconductor device.

If the object layer 110 includes an insulative material, the object layer pattern 115 may serve as a predetermined insulation pattern, e.g., an insulating interlayer pattern, a filling insulation pattern, or the like. In some embodiments, a portion of the object layer 110 removed by the above-mentioned photolithography process may be converted into a contact hole, an opening or a trench of the insulation pattern.

FIGS. 7 to 14 are cross-sectional views illustrating a method of forming a pattern in accordance with the present inventive concepts. For example, FIGS. 7 to 14 illustrate a method of forming a conductive pattern utilizing the above-mentioned photoresist polymer or the photoresist composition.

Detailed descriptions on processes and/or materials substantially the same as or similar to those illustrated with reference to FIGS. 1 to 6 are omitted herein.

Figure 7:
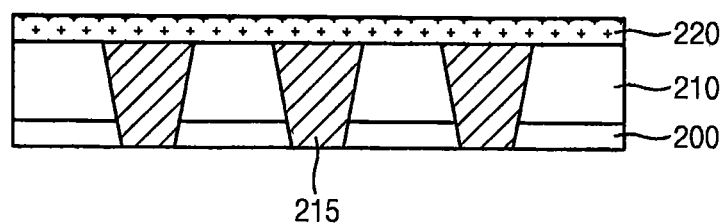
FIGS. 7 to 14 are cross-sectional views illustrating a method of forming a pattern according to further embodiments of the present inventive concepts.

Referring to FIG. 7, a lower contact 215 extending through a lower insulation layer 210 may be formed. A plurality of the lower contacts 215 may be formed in the lower insulation layer 210.

In some embodiments, the lower insulation layer 210 may be formed on a passivation layer 200, and a contact hole extending through the lower insulation layer 210 and the passivation layer 200 may be formed. The lower contact 215 may be formed by filling a conductive layer in the contact hole by a deposition process or a plating process.

In some embodiments, the method of forming patterns in accordance with the present inventive concepts may be implemented for the formation of the contact hole using the lower insulation layer 210 as an object layer.

The lower insulation layer 210 may be formed of an insulative material such as silicon oxide or silicon oxynitride. For example, the lower insulation layer 210 may be formed of a silicon oxide-based material such as plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG), or the like.

The passivation layer 200 may be formed of silicon nitride. The conductive layer may be formed of a metal such as aluminum (Al), tungsten (W) or copper (Cu), or a metal nitride.

In some embodiments, the lower contact 215 may be electrically connected to a circuit device or a lower wiring formed on a semiconductor substrate. Damage of the circuit device or the lower wiring while forming the contact hole may be prevented by the passivation layer 200.

A first etch-stop layer 220 may be formed on the lower insulation layer 210 to cover the lower contacts 215. The first etch-stop layer 220 may be formed of silicon nitride or silicon oxynitride. For example, the first etch-stop layer 220 may be formed by, e.g., a CVD process, a PECVD process, a spin coating process or an ALD process.

Figure 8:
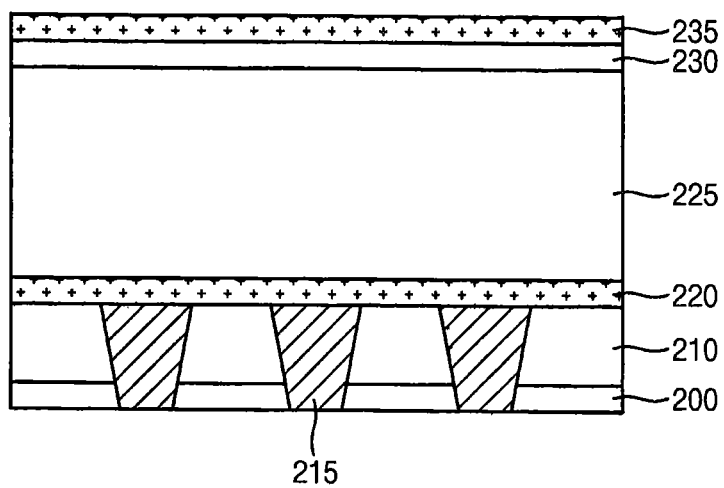

Referring to FIG. 8, an insulating interlayer 225, a buffer layer 230 and a second etch-stop layer 235 may be sequentially formed on the first etch-stop layer 220.

For example, the insulating interlayer 225 may be formed of the above-mentioned silicon oxide-based material or a polysiloxane-based material. The buffer layer 230 and the second etch-stop layer 235 may be formed of, e.g., silicon oxynitride and silicon nitride, respectively. A stress generated from the second etch-stop layer 235 may be alleviated and/or absorbed by the buffer layer 230.

The insulating interlayer 225, the buffer layer 230 and the second etch-stop layer 235 may be formed by a CVD process, a PECVD process, a sputtering process such as an ion beam sputtering process, a spin coating process, or the like.

Figure 9:
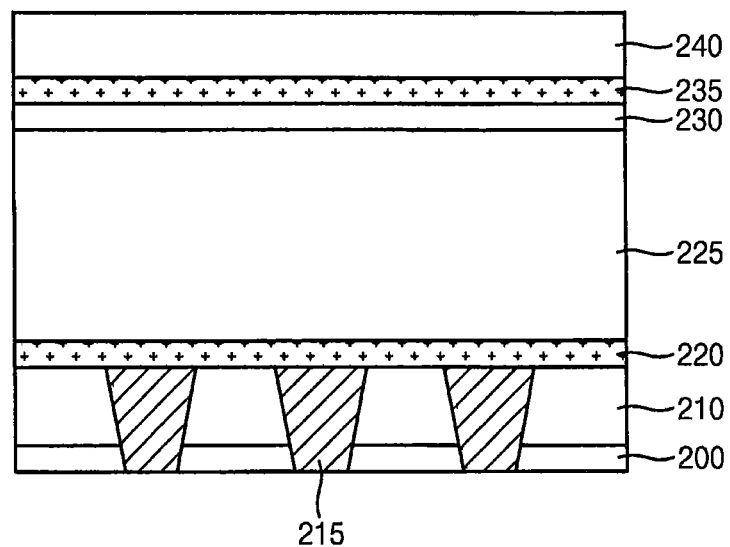

Referring to FIG. 9, a photoresist layer 240 may be formed on the second etch-stop layer 235.

The photoresist layer 240 may be formed using a photoresist composition according to embodiments of the present inventive concepts. As described above, the photoresist composition may include a photoresist polymer and a solvent. The photoresist polymer may include a first repeating unit containing a halogen donor group and a second repeating unit containing a protecting group connected by a sulfide bond, which may be repeated in a backbone chain. The photoresist composition may optionally include a PAG. In some embodiments, the photoresist composition may optionally include a sensitizer.

In some embodiments, the photoresist polymer may have a structure that may be represented by at least one of the above Chemical Formulae 1 to 4.

The photoresist composition may be coated to form a preliminary photoresist layer, and the preliminary photoresist layer may be cured by, e.g., a baking process to form the photoresist layer 240.

Figure 10:
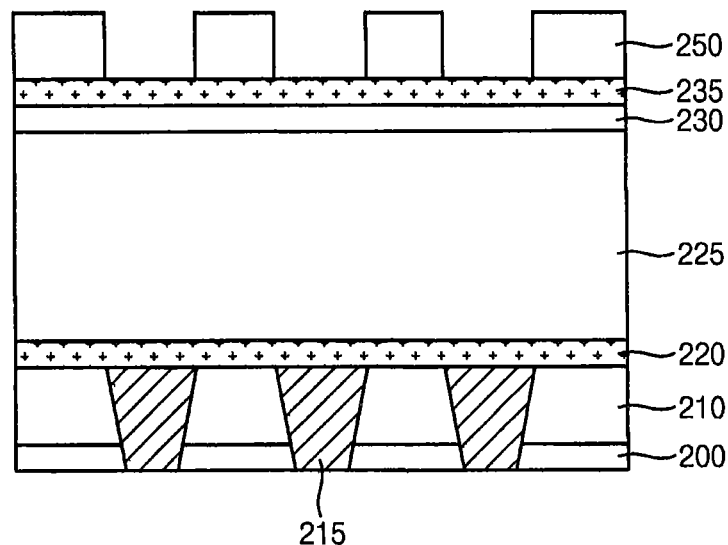

Referring to FIG. 10, processes substantially the same as or similar to those illustrated with reference to FIGS. 3 and 4 may be performed to form a photoresist pattern 250.

In some embodiments, an exposure process may be performed so that an active halogen may be generated from the halogen donor group included in an exposed portion. The active halogen may be transferred to the sulfide bond. Thus, a polarity and/or a hydrophilicity of the exposed portion may be increased by a photochemical reaction between the first and second repeating units.

In some embodiments, the buffer layer 230 may serve as an anti-reflective layer during the exposure process.

The exposed portion may be selectively removed by a developing process so that a photoresist pattern 250 may be formed.

Figure 11:
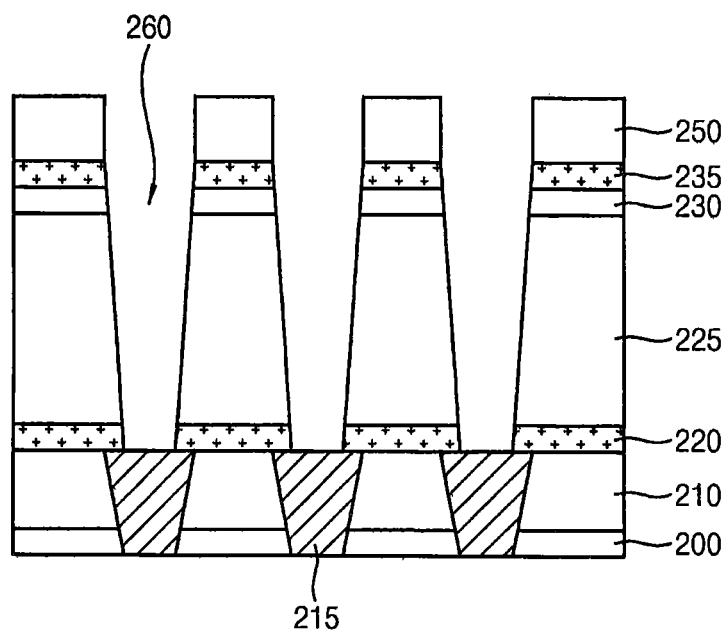

Referring to FIG. 11, the second etch-stop layer 235, the buffer layer 230, the insulating interlayer 225 and the first etch-stop layer 220 may be partially and sequentially etched using the photoresist pattern 250 as an etching mask. Thus, an opening 260 through which the lower contact 215 may be exposed may be formed.

The opening 260 may be formed by a dry etching process. The opening 260 may extend through the insulating interlayer 225 and the first etch-stop layer 220, and may at least partially expose an upper surface of the lower contact 215.

In some embodiments, the opening 260 may have a contact hole shape through which each lower contact 215 may be exposed. In some embodiments, the opening 260 may have a linear shape through which a plurality of the lower contacts 215 may be exposed.

Figure 12:
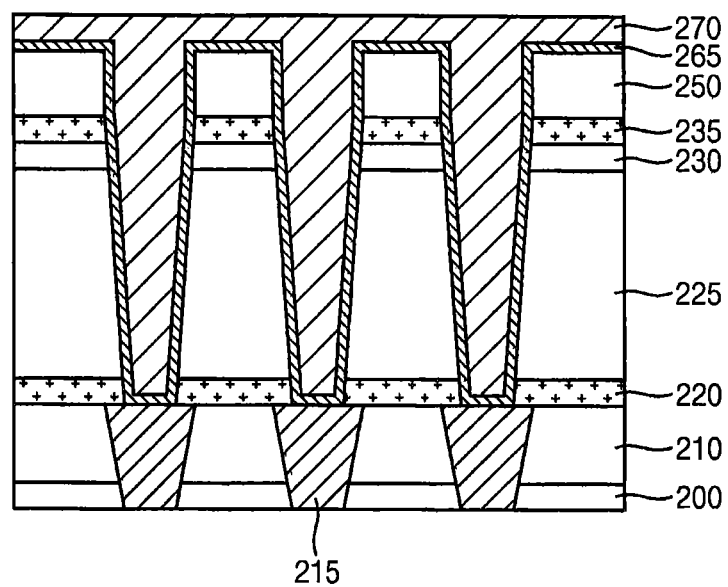

Referring to FIG. 12, a conductive layer 270 filling the openings 260 may be formed.

In some embodiments, a barrier layer 265 may be formed conformally along top surfaces and sidewalls of the photoresist pattern 250, and sidewalls and bottoms of the openings 260. The conductive layer 270 may be formed on the barrier layer 265 to sufficiently fill the openings 260.

The barrier layer 265 may be formed of a metal nitride such as titanium nitride, tantalum nitride or tungsten nitride. The barrier layer 265 may prevent a metal ingredient in the conductive layer 270 from being diffused into the insulating interlayer 225. The barrier layer 265 may also provide an adhesion for the formation of the conductive layer 270. The barrier layer 265 may be formed by, e.g., a sputtering process or an ALD process.

The conductive layer 270 may be formed by, e.g., an electroplating process. In this case, a seed layer may be formed conformally on the barrier layer 265 by a sputtering process using a copper target. A plating solution such as a copper sulfate solution may be prepared, and a current may be applied using the seed layer and the plating solution as a cathode and an anode, respectively. Thus, the conductive layer 270 including copper may be grown or precipitated on the seed layer through an electrochemical reaction.

In some embodiments, the conductive layer 270 may be deposited by a sputtering process using a metal target such as copper, tungsten or aluminum, or an ALD process.

Figure 13:
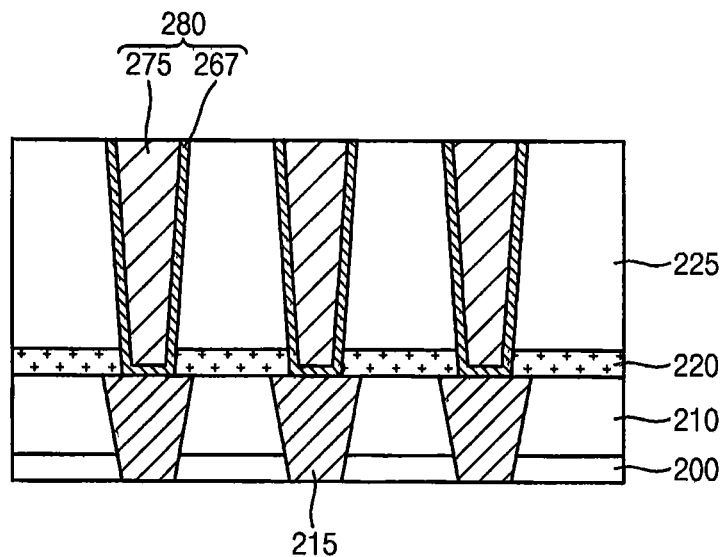

Referring to FIG. 13, upper portions of the conductive layer 270 and the barrier layer 265 may be planarized to form a conductive pattern 280.

In some embodiments, the upper portions of the conductive layer 270 and the barrier layer 265 may be planarized by a CMP process until a top surface of the insulating interlayer 225 is exposed. The photoresist pattern 250, the second etch-stop layer 235 and the buffer layer 230 may be also removed by the planarization process.

Accordingly, the conductive pattern 280 electrically connected to the lower contact 215 may be formed in the opening 260. The conductive pattern 280 may include a barrier layer pattern 267 formed on the sidewall and the bottom of the opening 260, and a conductive layer pattern 275 filling a remaining portion of the opening 260 on the barrier layer pattern 267.

FIGS. 12 and 13 illustrate that the photoresist pattern 250 may be removed by a planarization process for the formation of the conductive pattern 280. However, the photoresist pattern 250 may be removed after forming the opening 260 and before forming the barrier layer 265. For example, after forming the opening 260, the photoresist pattern 250 may be removed by an ashing process and/or a strip process.

In some embodiments, a cleaning process may further be performed to remove an etching residue including, e.g., a metal which may remain on the insulating interlayer 225.

Figure 14:
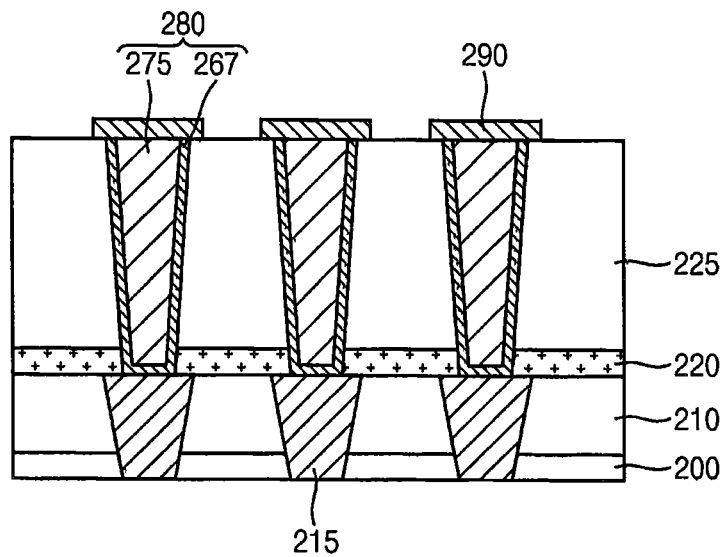

Referring to FIG. 14, a capping layer pattern 290 may be formed on an upper surface of the conductive pattern 280.

For example, a capping layer covering the conductive patterns 280 may be formed on the insulating interlayer 225, and the capping layer may be partially etched to form the capping layer pattern 290 which may cover the conductive pattern 280.

The capping layer may be formed of a metal that may be more chemically stable than a metal included in the conductive pattern 280 by a sputtering process or an ALD process. For example, the capping layer may be formed using a metal such as aluminum, cobalt or molybdenum. In some embodiments, the capping layer may be formed of a nitride of the metal.

The capping layer may be patterned by a wet etching process using an etchant solution that may include peroxide such as hydrogen peroxide.

In some embodiments, a build-up process may be further performed such that additional insulating interlayer, conductive pattern and/or upper wiring may be formed on the insulating interlayer 225 and the capping layer pattern 290. In this case, the conductive pattern 280 may serve as an interconnection structure electrically connecting the lower contact 215 and the upper wiring to each other. In some embodiments, the conductive pattern 280 may serve as a wiring extending linearly, and may be electrically connected to the plurality of the lower contacts 215.

As described above, the opening 260 for the formation of the conductive pattern 280 may be formed using the photoresist polymer or the photoresist composition according to example embodiments.

As a width of the conductive pattern 280 and a distance between conductive patterns 280 decreases, a photolithography process having high resolution may be needed. In some embodiments, an exposure process may be performed only through a photochemical reaction between the active halogen and the protecting group including the sulfide bond. Thus, an irregular acid diffusion occurring in a CAR system-based photolithography process may be avoided. Therefore, the conductive pattern having a fine pitch and a fine dimension may be formed as a desired uniform profile, and a resolution of the photolithography process may be improved.

Methods of Manufacturing Semiconductor Devices

FIGS. 15 to 25 are top plan views and cross-sectional views illustrating a method of manufacturing a semiconductor device according to the present inventive concepts.

Figure 15:
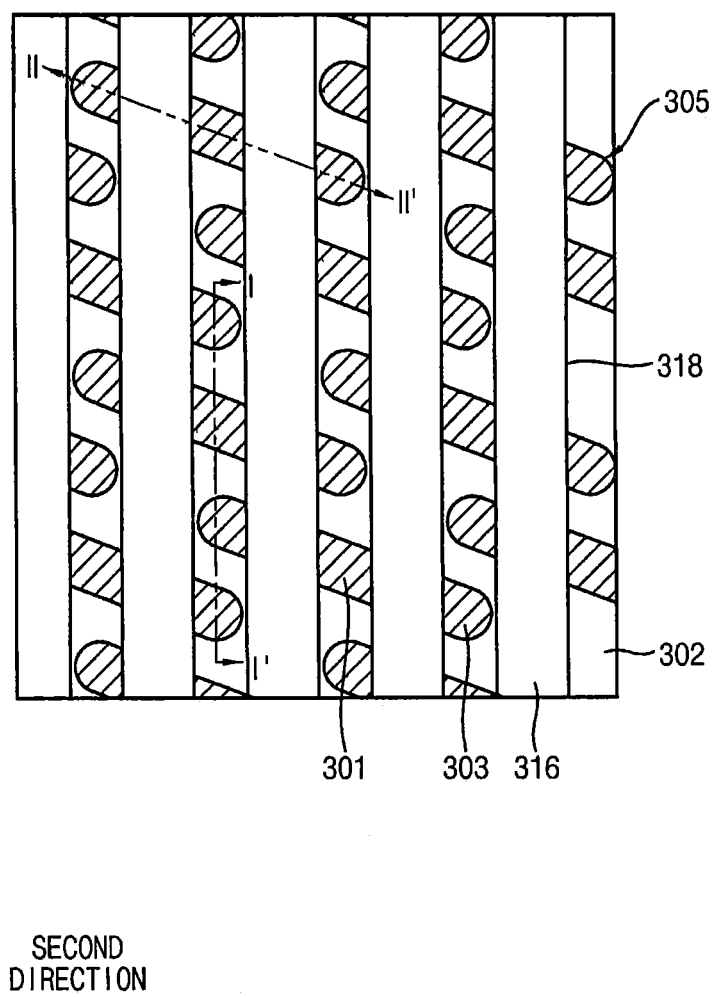
FIGS. 15 to 25 are top plan views and cross-sectional views illustrating a method of manufacturing a semiconductor device according to various embodiments of the present inventive concepts.
Figure 18:
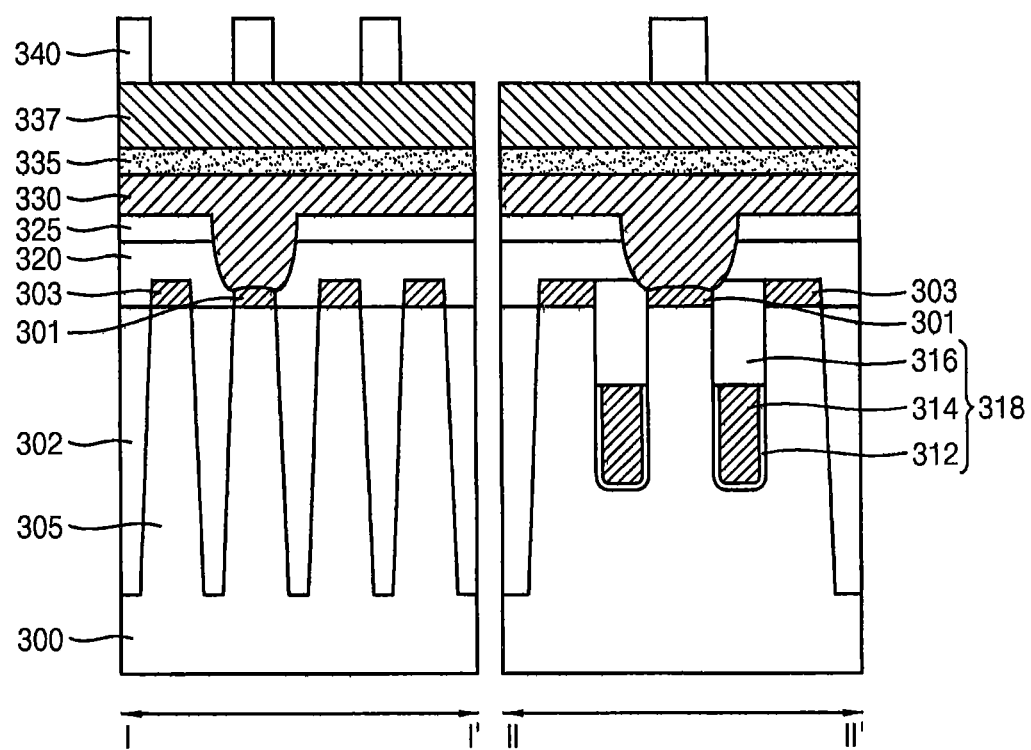
Figure 19:
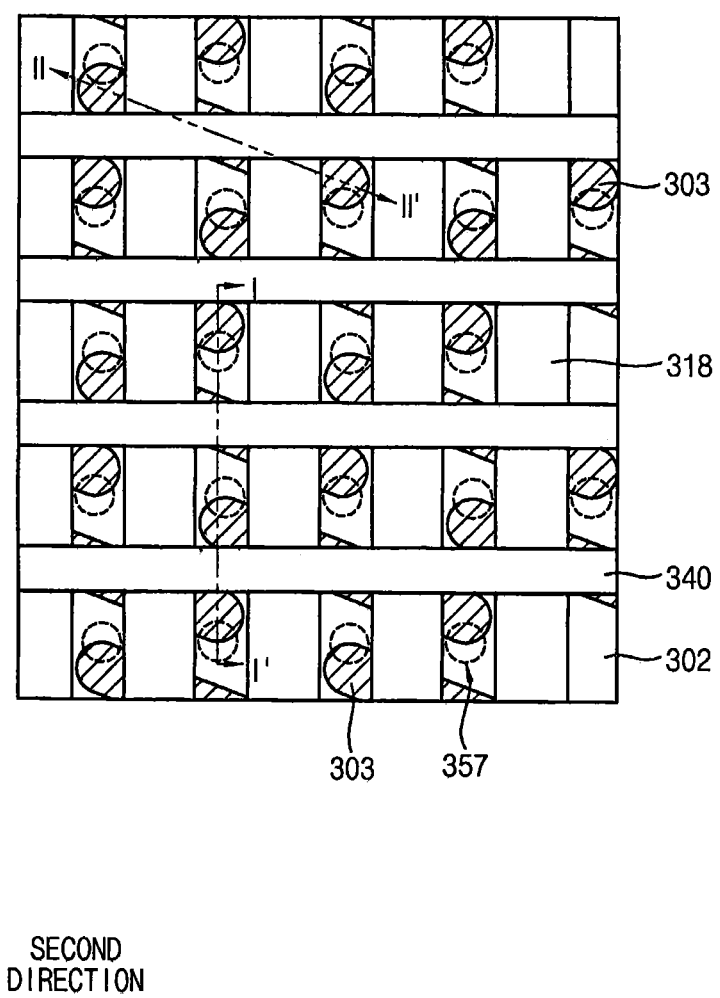

Specifically, FIGS. 15 and 19 are top plan views illustrating a method of manufacturing a semiconductor device. FIGS. 16 to 18, and FIGS. 20 to 25 are cross-sectional views illustrating the method of manufacturing the semiconductor device. Each of FIGS. 16 to 18, and FIGS. 20 to 25 includes sub-cross sectional views taken along lines I-I' and II-II' indicated in FIGS. 15 and 19.

For example, FIGS. 15 to 25 illustrate a method of manufacturing a semiconductor device including a buried cell array transistor (BCAT) structure.

Two directions perpendicular to each other are referred to as a first direction and a second direction. The first and second directions are parallel to a top surface of a substrate. Additionally, a direction indicated by an arrow and a reverse direction thereof are considered as the same direction.

Figure 16:
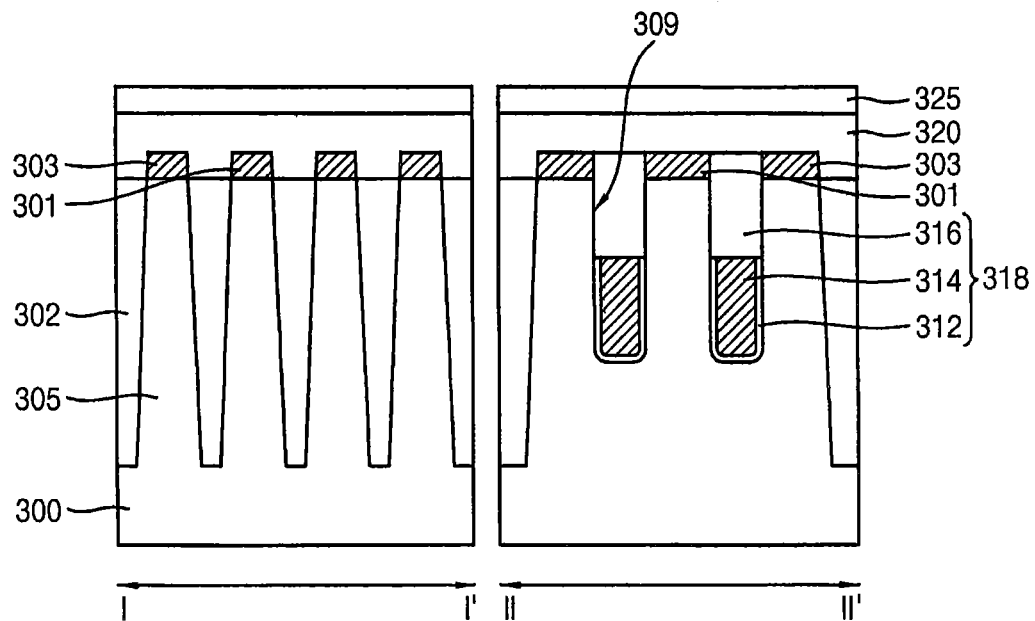

Referring to FIGS. 15 and 16, active patterns 305 and an isolation layer 302 may be formed at an upper portion of a substrate 300, and gate structures 318 extending in the active patterns 305 may be formed.

The substrate 300 may include silicon, germanium, silicon-germanium or a group III-V compound such as GaP, GaAs, or GaSb. In some embodiments, the substrate 300 may be an SOI substrate or a GOI substrate.

In example embodiments, the isolation layer 302 and the active patterns 305 may be formed by a shallow trench isolation (STI) process. For example, an upper portion of the substrate 300 may be partially removed by an anisotropic etching process to form an isolation trench. An insulation layer filling the isolation trench and including, e.g., silicon oxide may be formed on the substrate 300. An upper portion of the insulation layer may be planarized by, e.g., a CMP process until a top surface of the substrate 300 is exposed to form the isolation layer 302.

A plurality of the active patterns 305 may be formed to be spaced apart from each other by the isolation layer 302. As illustrated in FIG. 15, each active pattern 305 may extend in a diagonal direction to the first direction or the second direction at a given angle. The plurality of the active patterns 305 may be arranged in the first and second directions.

Upper portions of the active patterns 305 and the isolation layer 302 may be etched to form gate trenches 309, and the gate structure 318 may be formed in each gate trench 309.

For example, the gate trenches 309 may extend in the first direction, and a plurality of the gate trenches 309 may be formed along the second direction. In some embodiments, two of the gate trenches 309 may be formed at one of the active patterns 305.

In some embodiments, the gate trench 309 may be formed by a method of forming patterns in which the photoresist polymer or the photoresist composition according to the present inventive concepts may be used.

For example, a photoresist composition including a photoresist polymer that may contain first and second repeating units as described above may be coated on the active pattern 305 and the isolation layer 302 to form a photoresist layer. A portion of the photoresist layer overlapping the gate trench 309 may be modified into an exposed portion having increased polar and/or hydrophilic properties by an exposure process. The exposed portion may be removed by a developing process to form a photoresist pattern. Upper portions of the active pattern 309 and the isolation layer 302 may be etched using the photoresist pattern as an etching mask to form the gate trench 309.

Subsequently, a gate insulation layer 312 and a gate electrode 314 filling a lower portion of the gate trench 309 may be formed. A gate mask 316 capping the gate trench 309 may be formed on the gate insulation layer 312 and the gate electrode 314.

For example, the gate insulation layer 312 may be formed by a thermal oxidation process on a surface of the active pattern 305 exposed by the gate trench 309, or by depositing silicon oxide or a metal oxide through, e.g., a CVD process.

A gate conductive layer filling a remaining portion of the gate trench 309 may be formed on the gate insulation layer 312. The gate conductive layer may be planarized by a CMP process until the top surface of the active pattern 305 is exposed, and upper portions of the gate insulation layer 312 and the gate conductive layer may be removed by an etch-back process. Accordingly, the gate insulation layer 312 and the gate electrode 314 filling the lower portion of the gate trench 309 may be formed.

The gate conductive layer may be formed using a metal and/or a metal nitride by an ALD process or a sputtering process.

A mask layer filling a remaining portion of the gate trench 309 may be formed on the gate insulation layer 312 and the gate electrode 314, and an upper portion of the mask layer may be planarized until the top surface of the active pattern 305 is exposed to form the gate mask 316. The mask layer may be formed of silicon nitride by, e.g., a CVD process.

Accordingly, a gate structure 318 including the gate insulation layer 312, the gate electrode 314 and the gate mask 316, that may be sequentially stacked in the gate trench 309, may be formed.

According to an arrangement of the gate trenches 309, a plurality of the gate structures 318 may be formed to be arranged along the second direction and each gate structure 318 may extend in the first direction. The gate structure 318 may be buried or embedded in the active pattern 305. An upper portion of the active pattern 305 may be divided into a central portion between two gate structures 318, and a peripheral portion (or end portions) facing the central portion with respect to each of the gate structures 318.

An ion-implantation process may be performed to form a first impurity region 301 and a second impurity region 303 at upper portions of the active pattern 305 adjacent to the gate structures 318. For example, the first impurity region 301 may be formed at the central portion of the active pattern 305, and the second impurity region 303 may be formed at the peripheral portions of the active pattern 305.

In some embodiments, as illustrated in FIG. 16, an upper portion of the isolation layer 302 may be recessed by an etch-back process such that the upper portion of the active pattern 305 may be exposed. Subsequently, the ion-implantation process may be performed to form the first and second impurity regions 301 and 303.

A capping layer 320 covering the active patterns 305 and the isolation layer 302 may be formed, and a first insulating interlayer 325 may be formed on the capping layer 320. For example, the capping layer 320 and the first insulating interlayer 325 may be formed of silicon nitride and silicon oxide, respectively. The capping layer 320 may substantially serve as an etch-stop layer during subsequent etching processes.

Figure 17:
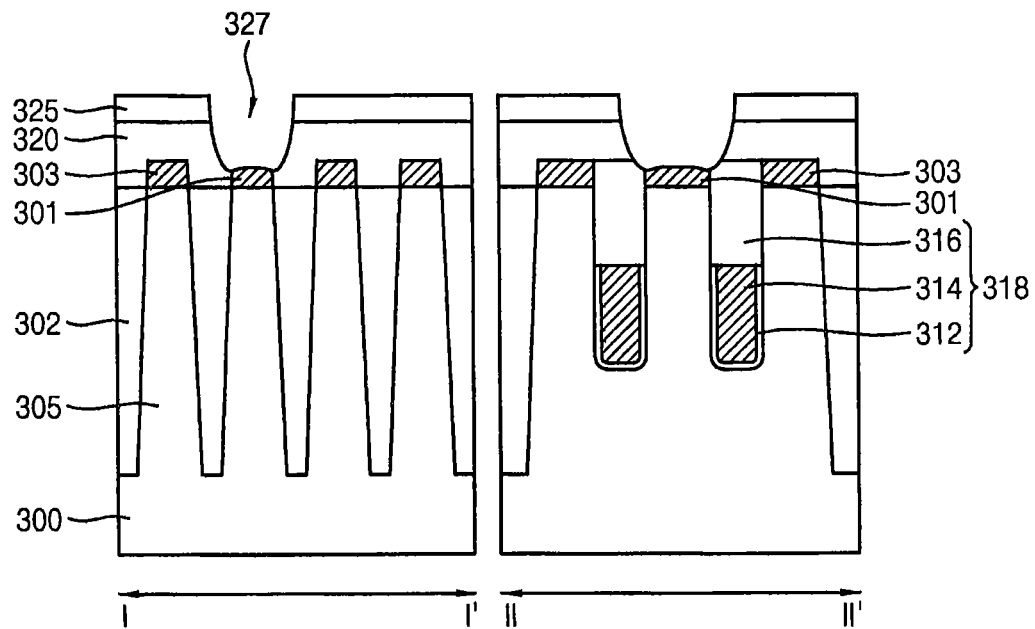

Referring to FIG. 17, the first insulating interlayer 325 and the capping layer 320 may be sequentially and partially etched to form a groove 327 through which the first impurity regions 301 may be exposed. The groove 327 may extend in the second direction indicated in FIG. 15, and a plurality of the grooves 327 may be formed to be arranged along the first direction.

In some embodiments, an upper portion of the first impurity region 301 may be partially removed during the etching process for the formation of the groove 327. Accordingly, a height difference may exist between the first and second impurity regions 301 and 303, and thus a bridge or a short circuit between a conductive line structure 345 and a conductive contact 375 (see FIG. 25) formed by subsequent processes may be prevented.

Referring to FIG. 18, a first conductive layer 330 filling the groove 327 may be formed on the first insulating interlayer 325. A barrier conductive layer 335 and a second conductive layer 337 may be sequentially formed on the first conductive layer 330, and a mask pattern 340 may be formed on the second conductive layer 337.

For example, the first conductive layer 330 may be formed using doped polysilicon, the barrier conductive layer 335 may be formed of a metal nitride or a metal silicide nitride, and the second conductive layer 337 may be formed using a metal. The first conductive layer 330, the barrier conductive layer 335 and the second conductive layer 337 may be formed by, e.g., a sputtering process, a PVD process, CVD process, or an ALD process.

The mask pattern 340 may include, e.g., silicon nitride, and may extend in the second direction. A width of the mask pattern 340 (e.g., a width in the first direction) may be smaller than that of the groove 327.

In some embodiments, the mask pattern 340 may be formed by a method of forming patterns in which a photoresist polymer or a photoresist composition according to the present inventive concepts may be used.

For example, a mask layer including silicon nitride may be formed on the second conductive layer 337. A photoresist composition including a photoresist polymer that may contain first and second repeating units as described above may be coated on the mask layer to form a photoresist layer. A portion of the photoresist layer overlapping the mask pattern 340 may be modified into an exposed portion having increased polar and/or hydrophilic properties by an exposure process. The exposed portion may be removed by a developing process to form a photoresist pattern. The mask layer may be etched using the photoresist pattern as an etching mask to form the mask pattern 340.

Figure 20:
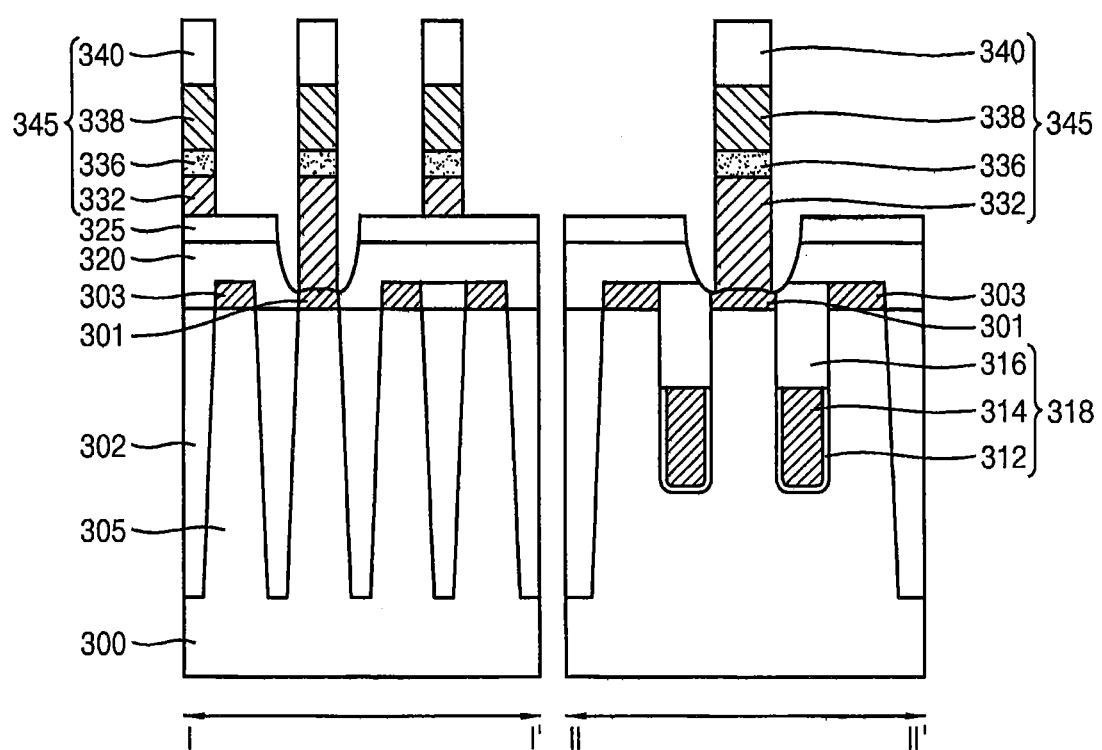

Referring to FIGS. 19 and 20, the second conductive layer 337, the barrier conductive layer 335 and the first conductive layer 330 may be sequentially etched using the mask pattern 340 as an etching mask. Accordingly, a first conductive layer pattern 332, a barrier conductive layer pattern 336 and a second conductive layer pattern 338 may be sequentially formed on the first impurity region 301. For convenience of descriptions, illustrations of the first insulating interlayer 325 and the capping layer 320 are omitted in FIG. 19.

Accordingly, the conductive line structure 345 including the first conductive layer pattern 332, the barrier conductive layer pattern 336, the second conductive layer pattern 338 and the mask pattern 340 may be formed. The conductive line structure 345 may extend in the second direction on the first impurity region 301. In example embodiments, the conductive line structure 345 may serve as a bit line.

In some embodiments, the conductive line structure 345 may have a narrower width that that of the groove 327. Thus, a sidewall of the conductive line structure 345 may be spaced apart from a sidewall of the groove 327.

Figure 21:
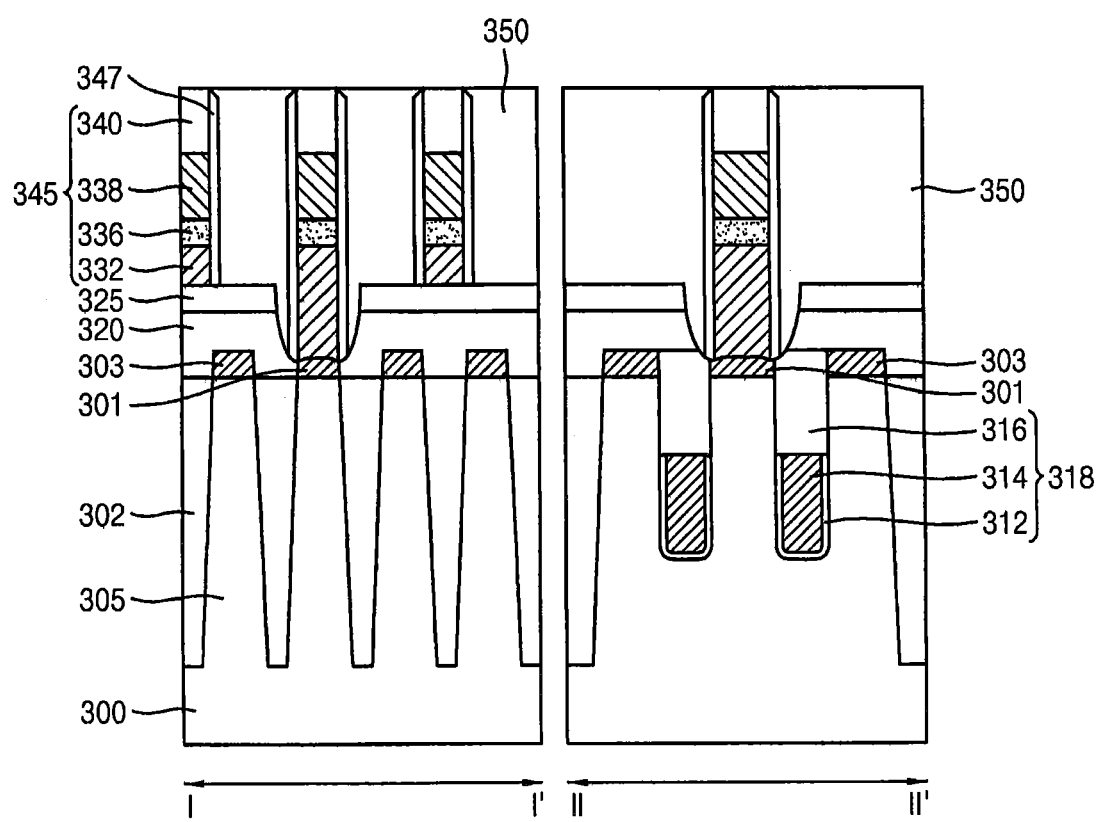

Referring to FIG. 21, a spacer 347 may be formed on a sidewall of the conductive line structure 345. For example, a spacer layer covering the conductive line structure 345 may be formed on the first insulating interlayer 325. The spacer layer may be anisotropically etched to form the spacer 347. The spacer layer may be formed of, e.g., silicon nitride.

A second insulating interlayer 350 covering the conductive line structure 345 may be formed on the first insulating interlayer 325. The second insulating interlayer 350 may fill a remaining portion of the groove 327.

In some embodiments, an upper portion of the second insulating interlayer 350 may be planarized by a CMP process such that a top surface of the mask pattern 340 may be exposed. The second insulating interlayer 350 may be formed of silicon oxide substantially the same as or similar to that of the first insulating interlayer 325.

Figure 22:
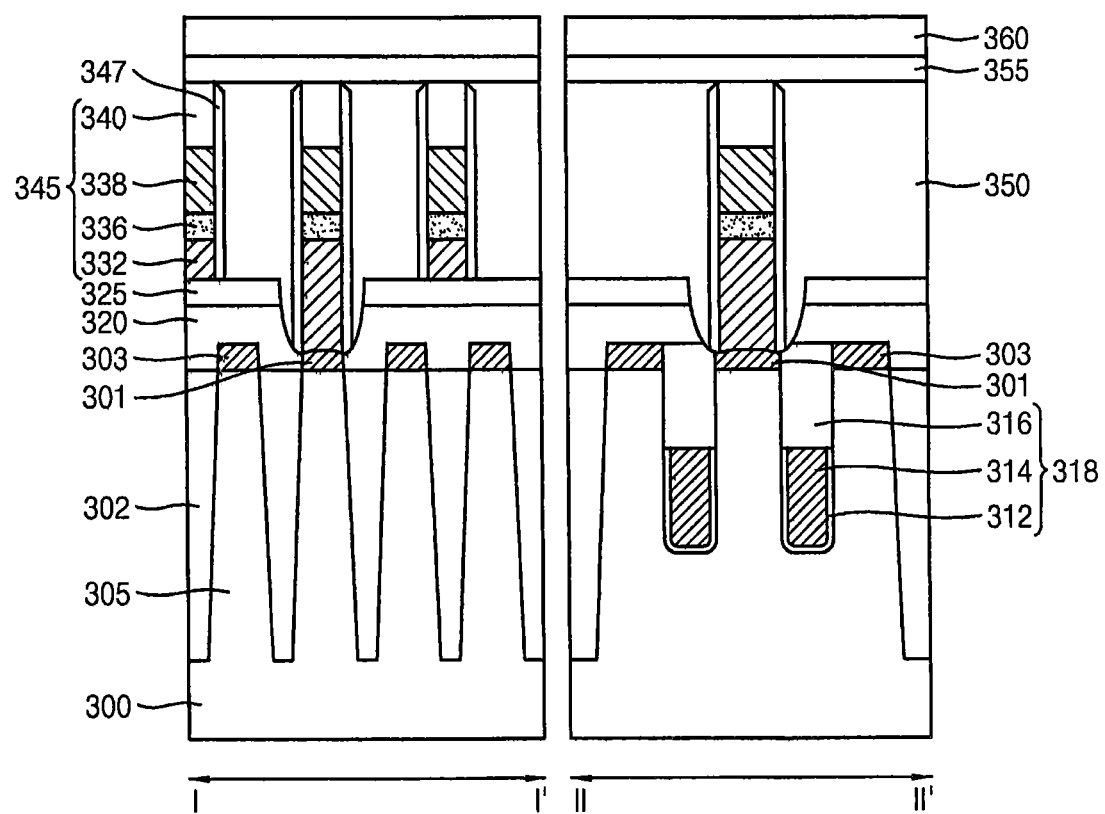

Referring to FIG. 22, a buffer layer 355 may be formed on the second insulating interlayer 350 and the mask pattern 340, and a photoresist layer 360 may be formed on the buffer layer 355.

The buffer layer 355 may substantially serve as a passivation layer or an anti-reflective layer. For example, the buffer layer 355 may be formed using an aromatic organic composition such as a phenol resin or a novolak resin, or an inorganic material such as silicon oxynitride. In an embodiment, the formation of the buffer layer 355 may be omitted.

The photoresist layer 360 may be formed using a photoresist composition in accordance with the present inventive concepts. As described above, the photoresist composition may include a photoresist polymer and a solvent. The photoresist polymer may include a first repeating unit containing a halogen donor group and a second repeating unit containing a protecting group connected by a sulfide bond, which may be repeated in a backbone chain. The photoresist composition may optionally include a PAG. In some embodiments, the photoresist composition may optionally include a sensitizer.

In some embodiments, the photoresist polymer may include a structure that may represented by at least one of the above Chemical Formulae 1 to 4.

The photoresist composition may be coated to form a preliminary photoresist layer, and then a curing process such as a baking process may be performed to form the photoresist layer 360.

Figure 23:
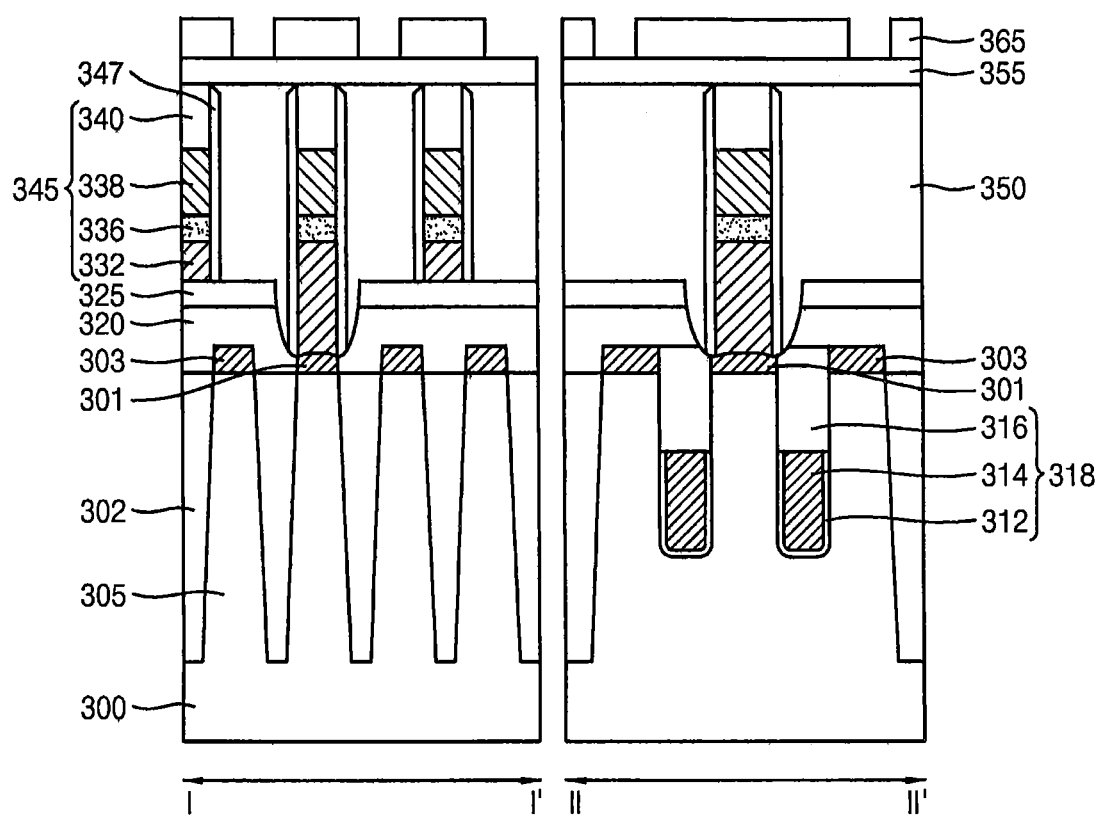

Referring to FIG. 23, processes substantially the same as or similar to those illustrated with reference to FIGS. 3 and 4 may be performed to form a photoresist pattern 365.

In example embodiments, an exposure process may be performed so that an active halogen may be generated from a halogen donor group included in an exposed portion. The active halogen may be transferred to a sulfide bond present in the exposed portion. Thus, a polarity and/or a hydrophilicity of the exposed portion may be increased by a photochemical reaction between moieties in the first and second repeating units of a photoresist polymer.

The exposed portion may be selectively removed by a developing process so that the photoresist pattern 365 may be formed. The photoresist pattern 365 may include a plurality of openings corresponding to hole formation areas 357 indicated in FIG. 19.

Figure 24:
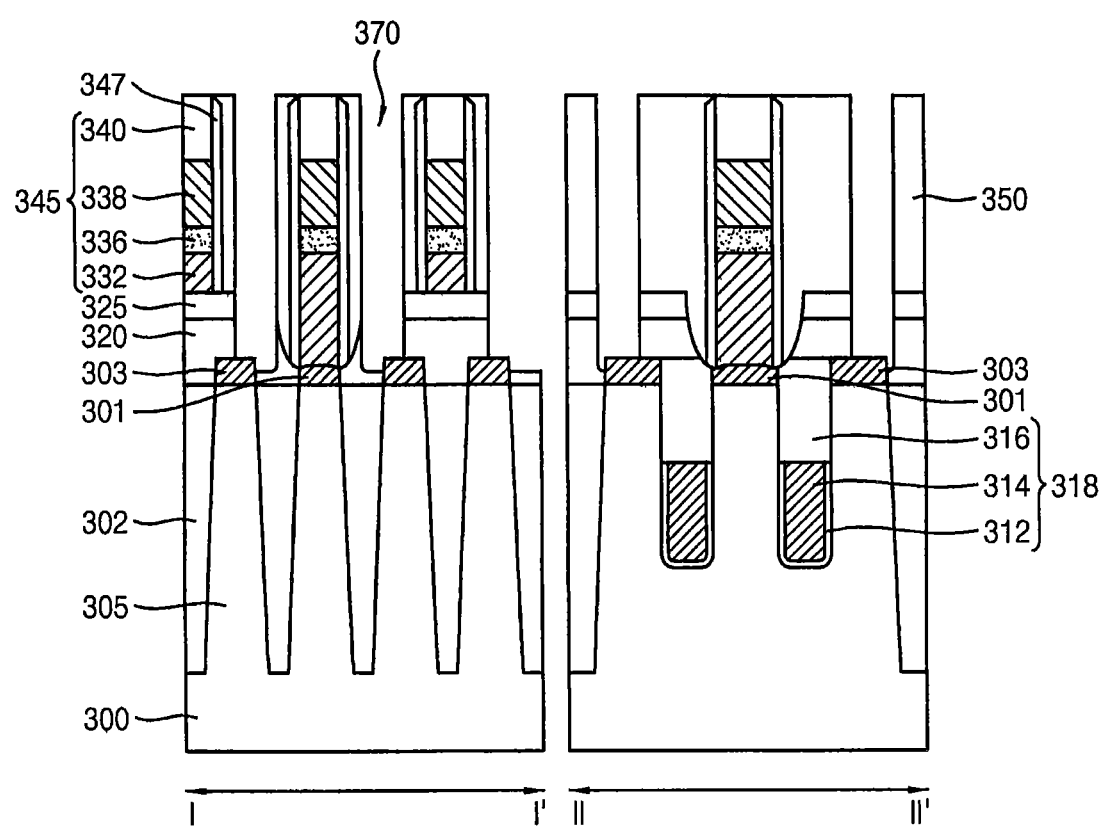

Referring to FIG. 24, the buffer layer 355, the second insulating interlayer 350, the first insulating interlayer 325 and the capping layer 320 may be partially etched using the photoresist pattern 365 as an etching mask. Accordingly, a contact hole 370 may be formed, which may at least partially expose the second impurity region 303. The contact hole 370 may be formed per each of hole formation areas 357 indicated in FIG. 19.

The photoresist pattern 365 and the buffer layer 355 may be removed by a CMP process, an ashing process and/or a strip process after the formation of the contact hole 370

Figure 25:
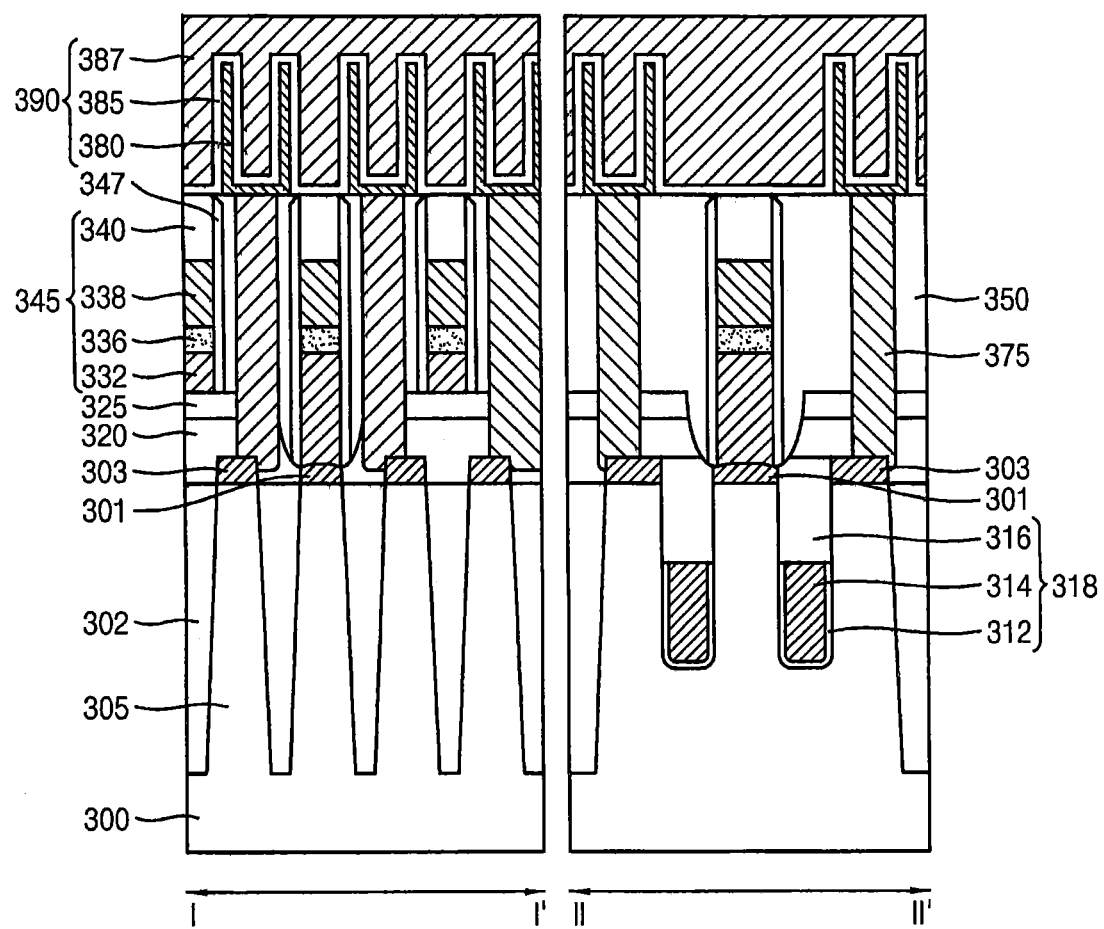

Referring to FIG. 25, the conductive contact 375 filling the contact hole 370 and electrically connected to the second impurity region 303 may be formed. For example, a capacitor 390 may be formed on the conductive contact 375. In this case, the conductive contact 375 may serve as a capacitor contact.

For example, a conductive layer filling the contact holes 370 may be formed, and an upper portion of the conductive layer may be planarized by a CMP process until the top surface of the mask pattern 340 is exposed. Accordingly, the conductive contact 375 may be formed in each contact hole 370, and may be in contact with the second impurity region 303.

The conductive layer may be formed using a metal such as copper or tungsten by a sputtering process, a PVD process, an ALD process, or a CVD process. In some embodiments, the conductive layer may be formed by an electroplating process or an electrolessplating process. In some embodiments, a barrier conductive layer including, e.g., titanium or titanium nitride may be formed on an innerwall of the contact hole 370 before forming the conductive layer.

The capacitor 390 electrically connected to the conductive contact 375 may be formed. Thus, a dynamic random access memory (DRAM) device having the BCAT structure may be achieved.

For example, an etch-stop layer and a mold layer (not illustrated) may be formed on the mask pattern 340, the second insulating interlayer 350 and the conductive contact 375. The mold layer and the etch-stop layer may be partially removed to form a capacitor opening through which a top surface of the conductive contact 375 is exposed.

A lower electrode layer may be formed along an innerwall of the capacitor opening and a top surface of the mold layer. The lower electrode layer may be formed of a metal or a metal nitride. For example, the lower electrode layer may be formed of at least one of tungsten, tungsten nitride, titanium, titanium nitride, tantalum, tantalum nitride and/or ruthenium. A sacrificial layer (not illustrated) may be formed on the lower electrode layer, and upper portions of the sacrificial layer and the lower electrode layer may be planarized such that the top surface of the mold layer is exposed. The sacrificial layer and the mold layer may be removed to form a lower electrode 380.

A dielectric layer 385 may be formed on surfaces of the etch-stop layer and the lower electrode 380, and an upper electrode 387 may be formed on the dielectric layer 385 to form the capacitor 390. The dielectric layer 385 may be formed of silicon oxide or a metal oxide having a high dielectric constant. The upper electrode 387 may be formed of a metal or a metal nitride substantially the same as or similar to that of the lower electrode 380.

In some embodiments, a magnetic tunnel junction (MTJ) structure may be formed on the conductive contact 375. In this case, the semiconductor device may serve as a magnetic random access memory (MRAM) device having the BCAT structure.

For example, a fixed layer, a tunnel barrier layer and a tunnel barrier layer interposed therebetween may be formed on the mask pattern 340, the second insulating interlayer 350 and the conductive contact 375. The fixed layer and the free layer may be formed of a magnetic material. The tunnel barrier layer may be formed of, e.g., at least one of magnesium oxide, titanium oxide, aluminum oxide, magnesium zinc oxide and magnesium boron oxide.

The free layer, the tunnel barrier layer and the fixed layer may be partially etched to form the MTJ structure on each conductive contact 375. In some embodiments, the etching process for the free layer, the tunnel barrier layer and the fixed layer may include a photolithography process or a method of forming patterns in which the photoresist composition or the photoresist polymer according to the present inventive concepts may be utilized.

According to example embodiments as described above, in a manufacture of a semiconductor device including, e.g., the BCAT structure, an exposure process based on a photochemical reaction between the active halogen and the protecting group including the sulfide bond may be performed instead of an exposure process based on a CAR system generating a large amount of acid. Thus, a reduction of resolution and a mis-alignment of, e.g., the contact holes 370 caused by an acid diffusion may be avoided.

The photoresist composition or the photoresist polymer in accordance with example embodiments may be used in a photolithography process for a formation of a fine pattern having a dimension of, e.g., about 20 nm. Wirings, contacts, insulation patterns, etc., of various semiconductor devices such as DRAM or MRAM devices may be formed by the photolithography process with high resolution and reliability.

The foregoing is illustrative of the present inventive concepts and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the present inventive concepts as well as the appended claims.

What is claimed is:

1. A method of forming a pattern, comprising:
   forming a photoresist layer on an object layer, the photoresist layer including a polymer that comprises a first repeating unit including a halogen donor group, and a second repeating unit including a leaving group capable of being removed from the polymer by a photochemical reaction, the leaving group being connected to the second repeating unit by a sulfide bond;
   performing an exposure process on the photoresist layer such that the photoresist layer is divided into an exposed portion and a non-exposed portion, wherein the exposure process is performed by at least one light source; and
   removing the exposed portion of the photoresist layer to form a photoresist pattern.

2. The method of claim 1, wherein a halonium ion or a halogen radical is generated from the halogen donor group by the exposure process.

3. The method of claim 2, wherein the leaving group is separated from the second repeating unit by the halonium ion or the halogen radical.

4. The method of claim 1, wherein the at least one light source is selected from ArF, KrF, an electron beam, I-line or extreme ultraviolet (EUV).

5. The method of claim 1, wherein forming the photoresist layer includes coating a photoresist composition on the object layer, the photoresist composition including the polymer, a solvent and a photoacid generator.

6. The method of claim 5, wherein a proton ($H^+$) generated from the photoacid generator is trapped by the halogen donor group.

7. The method of claim 6, wherein the halogen donor group includes a nitrogen-halogen bond and a carbonyl bond, and
   the proton is trapped by the carbonyl bond so that a halonium ion is generated from the nitrogen-halogen bond.

8. The method of claim 1, wherein the exposed portion is more hydrophilic than the non-exposed portion.

9. The method of claim 8, wherein the exposed portion includes an acetal structure to which a hydroxyl group is combined.

10. The method of claim 8, wherein removing the exposed portion includes selectively removing the exposed portion using a developing solution.

11. The method of claim 1, wherein the polymer includes a structure that is represented by Chemical Formula 1 or Chemical Formula 2:

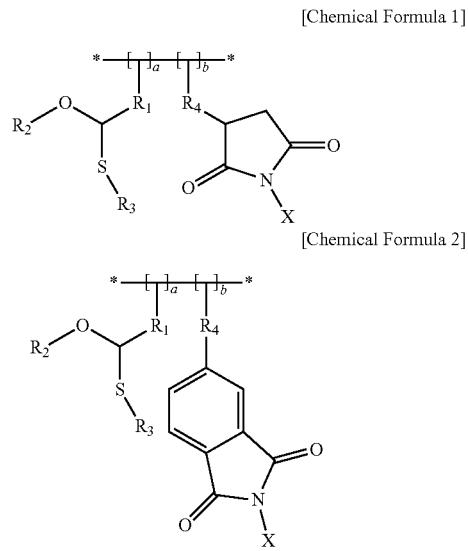

[Chemical Formula 1]

[Chemical Formula 2]

wherein, in Chemical Formulae 1 and 2, $R_1$ and $R_4$ are each independently a divalent group selected from styrene, hydroxystyrene, acrylate, $C_1$-$C_6$ alkylene, arylene, carbonyl, oxy, $C_6$-$C_{30}$ aliphatic ester, $C_6$-$C_{30}$ unsaturated aliphatic group or a combination thereof,
$R_2$ is hydrogen or a $C_1$-$C_{20}$ alkyl group,
$R_3$ is a $C_6$-$C_{30}$ aromatic group or a $C_1$-$C_{20}$ alkyl group,
X represents chlorine (Cl), bromine (Br) or iodine (I), and each a and b represents a mole ratio in a range of about 0.4 to about 0.6, and a sum of a and b is 1.

12. The method of claim 1, further comprising patterning the object layer using the photoresist pattern as an etching mask.

13. A method of forming a pattern, comprising:
forming a photoresist layer on an object layer, the photoresist layer including a polymer in which a first unit including a nitrogen-halogen bond, and a second unit including a sulfide bond are alternately polymerized;
performing a selective exposure process on the photoresist layer so that an active halogen is generated from the nitrogen-halogen bond, and the active halogen is transferred to the sulfide bond, wherein the selective exposure process performed by at least one light source; and
removing an exposed portion of the photoresist layer to form a photoresist pattern.

14. The method of claim 13, wherein the first unit includes at least one moiety selected from N-iodosuccinimide N-bromosuccinimide (NBS), N-chlorosuccinimide (NCS), N-iodophthalimide (NIPI), N-bromophthalimide (NBPI) or N-chlorophthalimide (NCPI).

15. The method of claim 13, wherein the second unit is represented by Chemical Formula 5:

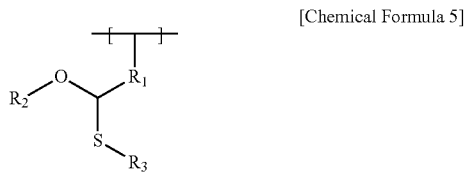

[Chemical Formula 5]

wherein, in Chemical Formula 5, $R_1$ is a divalent group selected from styrene, hydroxystyrene, acrylate, $C_1$-$C_6$ alkylene, arylene, carbonyl, oxy, $C_6$-$C_{30}$ aliphatic ester, $C_6$-$C_{30}$ unsaturated aliphatic group or a combination thereof,
$R_2$ is hydrogen or a $C_1$-$C_{20}$ alkyl group, and
$R_3$ is a $C_6$-$C_{30}$ aromatic group or a $C_1$-$C_{20}$ alkyl group.

16. The method of claim 15, wherein —$SR_3$ in the second unit is separated from the second unit by the active halogen.

17. The method of claim 16, wherein the exposed portion is converted to a hydrophilic pattern.

18. A method of forming a pattern, comprising:
forming a photoresist layer on an object layer, the photoresist layer including a polymer that comprises a first repeating unit including a halogen donor group, and a second repeating unit including a leaving group capable of being removed from the polymer by a photochemical reaction, the leaving group being connected to the second repeating unit by a sulfide bond;
generating a halonium ion or a halogen radical from the first repeating unit of the polymer by performing an exposure process on the photoresist layer such that the photoresist layer is divided into an exposed portion and a non-exposed portion, wherein the exposure process is performed by at least one light source;
removing the leaving group from the second repeating unit of the polymer; and
removing the exposed portion of the photoresist layer to form a photoresist pattern.

19. The method of claim 18, wherein the halonium on or the halogen radical reacts with a sulfur atom in the sulfide bond to remove the leaving group from the second repeating unit of the polymer.

20. The method of claim 18, wherein the leaving group from the second repeating unit of the polymer is replaced with a hydroxyl group.

* * * * *